(12) United States Patent
King et al.

(10) Patent No.: US 10,611,897 B2
(45) Date of Patent: *Apr. 7, 2020

(54) ARABITOL AND XYLITOL BASED FLAME RETARDANTS

(71) Applicant: International Business Machines Corporation, Armonk, NY (US)

(72) Inventors: Scott B. King, Rochester, MN (US); Brandon M. Kobilka, Tucson, AZ (US); Joseph Kuczynski, North Port, FL (US); Jason T. Wertz, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 34 days.

This patent is subject to a terminal disclaimer.

(21) Appl. No.: 15/806,133

(22) Filed: Nov. 7, 2017

(65) Prior Publication Data

US 2019/0136014 A1 May 9, 2019

(51) Int. Cl.
*C08K 5/5337* (2006.01)
*C07F 9/30* (2006.01)
(Continued)

(52) U.S. Cl.
CPC .............. *C08K 5/5337* (2013.01); *C07F 9/12* (2013.01); *C07F 9/305* (2013.01); *C07F 9/4015* (2013.01);
(Continued)

(58) Field of Classification Search
CPC ......... C09K 21/12; C07H 11/04; C07F 9/113; C07F 9/4078
(Continued)

(56) References Cited

U.S. PATENT DOCUMENTS 3,352,947 A * 11/1967 Lew .................. C07F 9/142
523/451
4,207,270 A * 6/1980 Mayer .............. C07F 9/657118
558/78
(Continued)

FOREIGN PATENT DOCUMENTS

DE 102008050371 B3 * 4/2010 ......... C08G 18/3885
EP 2574615 A1 * 4/2013 ........... C07F 9/6561
(Continued)

OTHER PUBLICATIONS

Derwent Abstract of EP 2574615 (2013, 4 pages).*
(Continued)

*Primary Examiner* — Brieann R Johnston
(74) *Attorney, Agent, or Firm* — James L. Olsen

(57) ABSTRACT

A flame retardant sugar-derived molecule, a process for forming a flame retardant sugar-derived molecule, and an article of manufacture comprising a flame retardant sugar-derived molecule are disclosed. The flame retardant sugar-derived molecule can be synthesized from arabitol, xylitol, arabic acid, or xylonic acid obtained from a bio-based source, and can have at least one phosphoryl or phosphonyl moiety. The process for forming the flame retardant sugar-derived molecule can include reacting arabitol, xylitol, arabic acid, or xylonic acid and a flame retardant phosphorus-based molecule to form the flame retardant sugar-derived molecule.

3 Claims, 27 Drawing Sheets

(51) Int. Cl.

| | | |
|---|---|---|
| *C07F 9/655* | (2006.01) | |
| *C08K 5/5373* | (2006.01) | |
| *C08K 5/529* | (2006.01) | |
| *C08K 5/5313* | (2006.01) | |
| *C09J 11/06* | (2006.01) | |
| *H05K 1/03* | (2006.01) | |
| *C07F 9/40* | (2006.01) | |
| *C08F 130/02* | (2006.01) | |
| *C07F 9/12* | (2006.01) | |
| *C08G 59/02* | (2006.01) | |
| *C08G 64/02* | (2006.01) | |
| *C08K 5/523* | (2006.01) | |
| *C08K 5/5333* | (2006.01) | |
| *C08K 5/5353* | (2006.01) | |

(52) U.S. Cl.
CPC .......... *C07F 9/4021* (2013.01); *C07F 9/4046* (2013.01); *C07F 9/4093* (2013.01); *C07F 9/65502* (2013.01); *C07F 9/65505* (2013.01); *C07F 9/65515* (2013.01); *C08F 130/02* (2013.01); *C08G 59/02* (2013.01); *C08G 64/0258* (2013.01); *C08K 5/523* (2013.01); *C08K 5/529* (2013.01); *C08K 5/5313* (2013.01); *C08K 5/5333* (2013.01); *C08K 5/5353* (2013.01); *C08K 5/5373* (2013.01); *C09J 11/06* (2013.01); *H05K 1/0353* (2013.01); *C09J 2203/326* (2013.01); *C09J 2205/102* (2013.01); *H05K 2201/012* (2013.01); *H05K 2201/0145* (2013.01); *H05K 2201/0154* (2013.01)

(58) Field of Classification Search
USPC ........................................................ 536/117
See application file for complete search history.

(56) References Cited

U.S. PATENT DOCUMENTS

| | | | |
|---|---|---|---|
| 6,512,133 B1 * | 1/2003 | Gotzmann | C07F 9/093 558/114 |
| 6,822,025 B2 | 11/2004 | Bajgur et al. | |
| 9,688,867 B2 | 6/2017 | Zammarano et al. | |
| 2004/0082712 A1 | 4/2004 | Blount | |
| 2004/0138477 A1 * | 7/2004 | Gotzmann | C07D 251/64 549/220 |
| 2005/0079785 A1 | 4/2005 | Bond et al. | |
| 2010/0152376 A1 | 6/2010 | Wermter | |
| 2011/0224331 A1 * | 9/2011 | Ross | C08K 5/521 523/447 |
| 2014/0179814 A1 | 6/2014 | Mooney et al. | |
| 2016/0083500 A1 * | 3/2016 | Balbo Block | C08G 18/5075 521/165 |
| 2016/0145285 A1 | 5/2016 | Garbark et al. | |
| 2016/0152798 A1 * | 6/2016 | Kamimoto | C08K 3/26 524/100 |
| 2016/0177182 A1 | 6/2016 | Carlson et al. | |
| 2017/0204130 A1 * | 7/2017 | Pan | C07F 9/657172 |
| 2019/0055472 A1 * | 2/2019 | King | C09K 21/12 |

FOREIGN PATENT DOCUMENTS

| | | | |
|---|---|---|---|
| JP | 59210987 A | * | 11/1984 |
| WO | 2011050480 A1 | | 5/2011 |
| WO | 2012140237 A1 | | 10/2012 |
| WO | 2013163230 A2 | | 10/2013 |
| WO | 2014021827 A1 | | 2/2014 |

OTHER PUBLICATIONS

Derwent Abstract of JP 59210987 (1984, 2 pages).*
Derwent Abstract of DE 102008050371 (2010, 5 pages).*
"Dimethyl acetals," Organic Chemistry Portal, printed Jun. 8, 2017, pp. 1-2. http://www.organic-chemistry.org/protectivegroups/carbonyl/dimethylacetals.htm.

* cited by examiner

A: 240, cat. DMAP, DCM, reflux
B: Deprotection
C: DPCPa or DPCPo, DMAP, DCM, reflux
D: DPCPa or DPCPo, MgO
E: 240, cat. MgO A: 240, cat. DMAP, DCM, reflux
B: Deprotection
C: DPCPa or DPCPo, DMAP, DCM, reflux
D: DPCPa or DPCPo, MgO
E: 240, cat. MgO

ARABITOL AND XYLITOL BASED FLAME RETARDANTS

BACKGROUND

The present disclosure relates generally to the field of bio-renewable compounds, and more particularly, to bio-renewable flame retardants.

Bio-based, sustainable compounds can be used in the syntheses of substances that previously required petroleum-based raw materials. For example, bio-based compounds can be used in polymers, flame retardants, cross-linkers, etc. There are numerous strategies for efficiently and inexpensively producing bio-based compounds on an industrial scale. These strategies can include fermentation technologies, membrane technologies, and genetic engineering, to name a few.

SUMMARY

A flame retardant sugar-derived molecule, a process for forming a flame retardant sugar-derived molecule, and an article of manufacture comprising a flame retardant sugar-derived molecule are disclosed. The flame retardant sugar-derived molecule can be synthesized from arabitol, xylitol, arabic acid, or xylonic acid obtained from a bio-based source, and can have at least one phosphoryl or phosphonyl moiety. The process for forming the flame retardant sugar-derived molecule can include reacting arabitol, xylitol, arabic acid, or xylonic acid and a flame retardant phosphorus-based molecule to form the flame retardant sugar-derived molecule.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
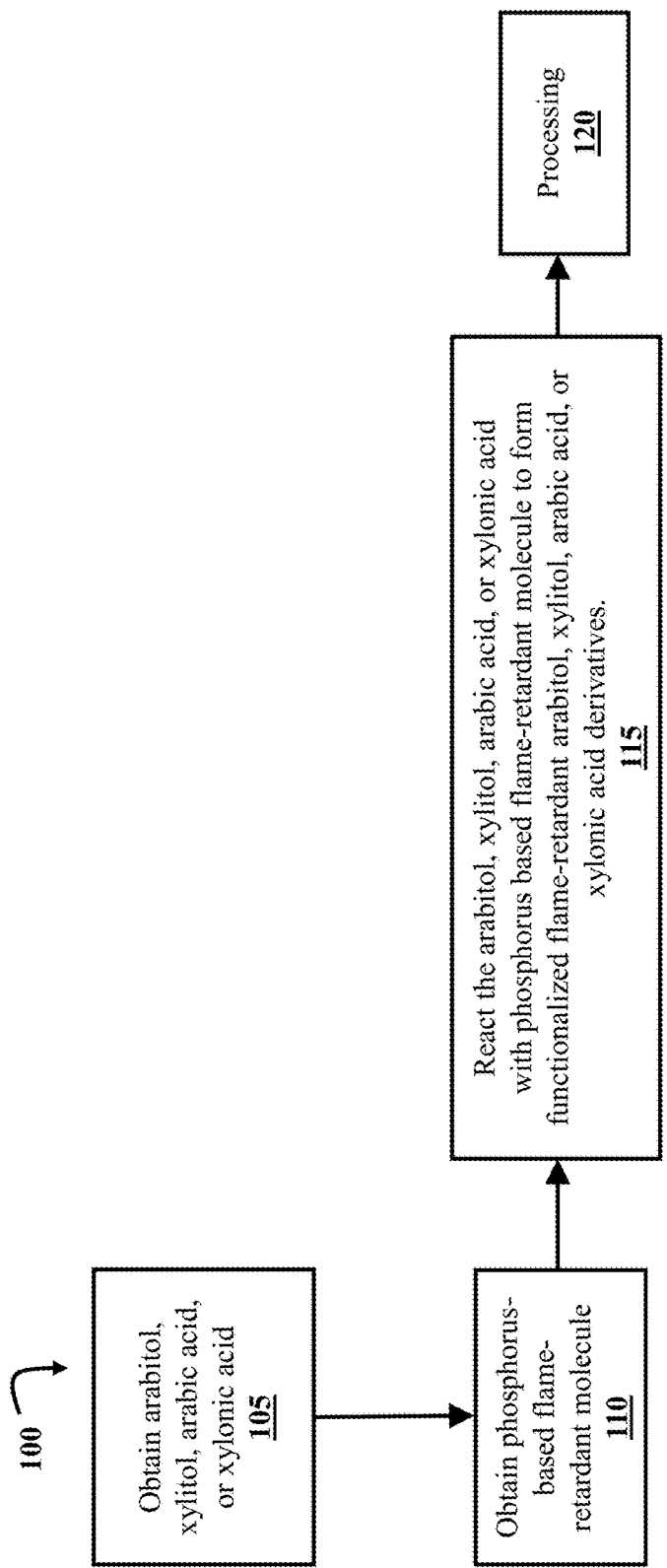
FIG. 1 is a flow diagram illustrating a process of forming a flame retardant polymer containing arabitol-derived or xylitol-derived molecules, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of bio-renewable compounds, and more particularly, to bio-renewable flame retardants. While the present disclosure is not necessarily limited to such applications, various aspects of the disclosure may be appreciated through a discussion of various examples using this context.

Bio-based compounds are increasingly being used in the syntheses of substances that previously required petroleum-based raw materials. One benefit of bio-based compounds is that they are from renewable resources. Therefore, these compounds have applications in sustainable, or "green," materials. Sustainable materials are becoming more and more prevalent due to the rising costs of fossil fuels and increasing environmental regulatory controls. Advances in biotechnology have provided numerous strategies for efficiently and inexpensively producing bio-based compounds on an industrial scale. For example, these strategies can be found in fermentation technologies, membrane technologies, and genetic engineering. Two approaches that can use biotechnologies are plant-based and microorganism-based approaches. Plant-based approaches can involve obtaining a material directly from a plant, or growing plant tissues or cells that can produce bio-based compounds from various substrates using their own biosynthetic pathways. Microorganism-based approaches involve using native or genetically modified fungi, yeast, or bacteria to produce a desired compound from a structurally similar substrate.

Bio-based compounds can be used in a variety of applications. For example, bio-based compounds can be used in polymers, flame retardants, and compounds. In some examples, bio-based polymers and petroleum-based polymers are blended to form a polymer composite. However, polymers can also be entirely bio-based, or produced from a combination of bio- and petroleum-based monomers. Bio-based compounds can impart flame retardant properties to bio-and petroleum-based polymers. For example, flame retardant molecules or compounds can be incorporated into polymers. Additionally, flame retardant monomers can be polymerized to form flame retardant polymers.

Arabitol, xylitol, and their oxidized derivatives (arabic acid and xylonic acid, respectively) are examples of bio-based compounds that have applications as a component of various polymers, resins, and monomers. Arabitol and xylitol are sugar alcohols which can be obtained from a variety of bio-based sources, including fermentative and biocatalytic processes in bacteria, fungi, and yeast cells. For example, arabitol can be purified from industrial fermentation of *Debaryomyces hansenii* or *Debaryomyces nepalensis*. Xylitol is commonly produced in yeast strains such as *Candida tropicalis* and *Candida guilliermondii*. Xylitol and arabitol can also be obtained by the reduction (e.g., via hydrogenation) of either arabinose or lyxose.

According to embodiments of the present disclosure, arabitol, arabic acid, xylitol, and xylonic acid are used as a precursor for various flame retardant molecules (e.g., small molecules or functionalized molecules). The arabitol, arabic acid, xylitol, and xylonic acid flame retardant molecules can be added to polymers, fabrics, resins, or other materials during blending, curing, foaming, extrusion, or other processing techniques. In addition to directly adding the arabitol, arabic acid, xylitol, and xylonic acid derived flame retardants into the materials during processing, the flame retardants may be integrated into microcapsules. Arabitol, arabic acid, xylitol, and xylonic acid compounds each have five functional R groups, which can bind to resins and/or polymers. The addition of these compounds causes a resin or polymer to be flame retardant. The arabitol, arabic acid, xylitol, and xylonic acid derived molecules can be multifunctional (e.g., monofunctional or difunctional), depending on the number of functional R groups bound to the molecules. Specifically, arabitol, arabic acid, xylitol, and xylonic acid derived molecules can be mono-, di-, tri-, tetra-, and pentafunctionalized. The multifunctionalized molecules can be polymerized or bound as monofunctional compounds. Further, di-, tri, tetra, and pentafunctionalized compounds can be cross-linked.

FIG. 1 is a flow diagram illustrating a process 100 of forming a flame retardant polymer containing arabitol, xylitol, arabic acid, and xylonic acid derived molecules, in accordance with embodiments of the present disclosure. Process 100 begins by obtaining arabitol, arabic acid, xylitol, and xylonic acid at step 105. These molecules may be naturally obtained (e.g., from various biological sources) or synthesized from other biomolecules (e.g., arabitol and xylitol can be obtained by the reduction of arabinose or lyxose). Further, arabic acid and xylonic acid can be synthesized by oxidizing arabitol and xylitol, respectively. At step 110, phosphorus-based flame retardant molecules are obtained. The phosphorus-based flame retardant molecules may have either a phosphoryl or a phosphonyl moiety (collectively referred to as an FR group) with an attached R functional group or phenyl (Ph) group. The R groups that are attached to the FR groups can vary, as is discussed in greater detail below. The phosphorus-based flame retardant molecules can be phosphate- or phosphonate-based flame retardant molecules. The structures and syntheses of phosphorus-based flame retardant molecules are discussed in greater detail with regard to FIGS. 2-3D.

After arabitol, xylitol, arabic acid, or xylonic acid molecules and phosphorus-based flame retardant molecules are obtained at steps 105 and 110, respectively, the arabitol, xylitol, arabic acid, or xylonic acid molecules are reacted with the phosphorus-based flame retardant molecules to form functionalized flame retardant arabitol, xylitol, arabic acid, and xylonic acid derived molecules at step 115. The structures and syntheses of the functionalized flame retardant molecules are discussed in greater detail with regard to FIGS. 6-12.

The structure of the functionalized flame retardant molecule formed at operation 115 is determined by the precursor (e.g., arabitol, xylitol, arabic acid, and xylonic acid) and phosphorus-based flame retardant molecule used in the reaction. The phosphorus-based flame retardant molecule reacts with a hydroxyl and/or carboxylic acid group on the arabitol, xylitol, arabic acid, or xylonic acid to provide an FR group with an attached R functional group. Examples of R groups can include phenyl substituents, epoxy functional groups, allyl functional groups, propylene carbonate substituents, hydroxyl-functionalized thioether substituents, amino-functionalized thioether substituents, carboxylic acid-functionalized thioether substituents, etc. The syntheses and structures of the functionalized flame retardant arabitol, xylitol, arabic acid, or xylonic acid molecules are discussed in greater detail with regard to FIGS. 6-12.

The arabitol, xylitol, arabic acid, or xylonic acid derived flame retardant molecules are processed at step 120. The nature of the processing may depend on the identity of the flame retardant derivative. Processing 120 may include chemically reacting a functionalized (e.g., monofunctional, difunctional, trifunctional, etc.) flame retardant arabitol, xylitol, arabic acid, or xylonic acid derived molecule with a polymer, forming a bond between the flame retardant and the polymer. In some embodiments, processing 120 may include adding a flame retardant arabitol, xylitol, arabic acid, or xylonic acid small molecule to a polymer (e.g., during blending, extrusion, etc.). Examples of polymers include epoxies, polyhydroxyurethanes, polycarbonates, polyesters, polyacrylates, polyimides, polyamides, polyureas, poly(vinyl-esters), etc. The materials for these polymers can come from petroleum-based sources, bio-based sources, or a combination of petroleum- and bio-based sources. Further, in some embodiments, the flame retardant molecules can be used in non-polymeric applications, such as resins for varnishes and adhesives. Flame retardant arabitol, xylitol, arabic acid, or xylonic acid monomers may be polymerized in a reaction with a base and/or second monomer. Additionally, in some embodiments, the monomers may be polymerized in a reaction with a Ziegler-Natta catalyst. Polymerizations reactions with the flame retardant monomers are discussed in greater detail with regard to FIG. 12.

Figure 2:
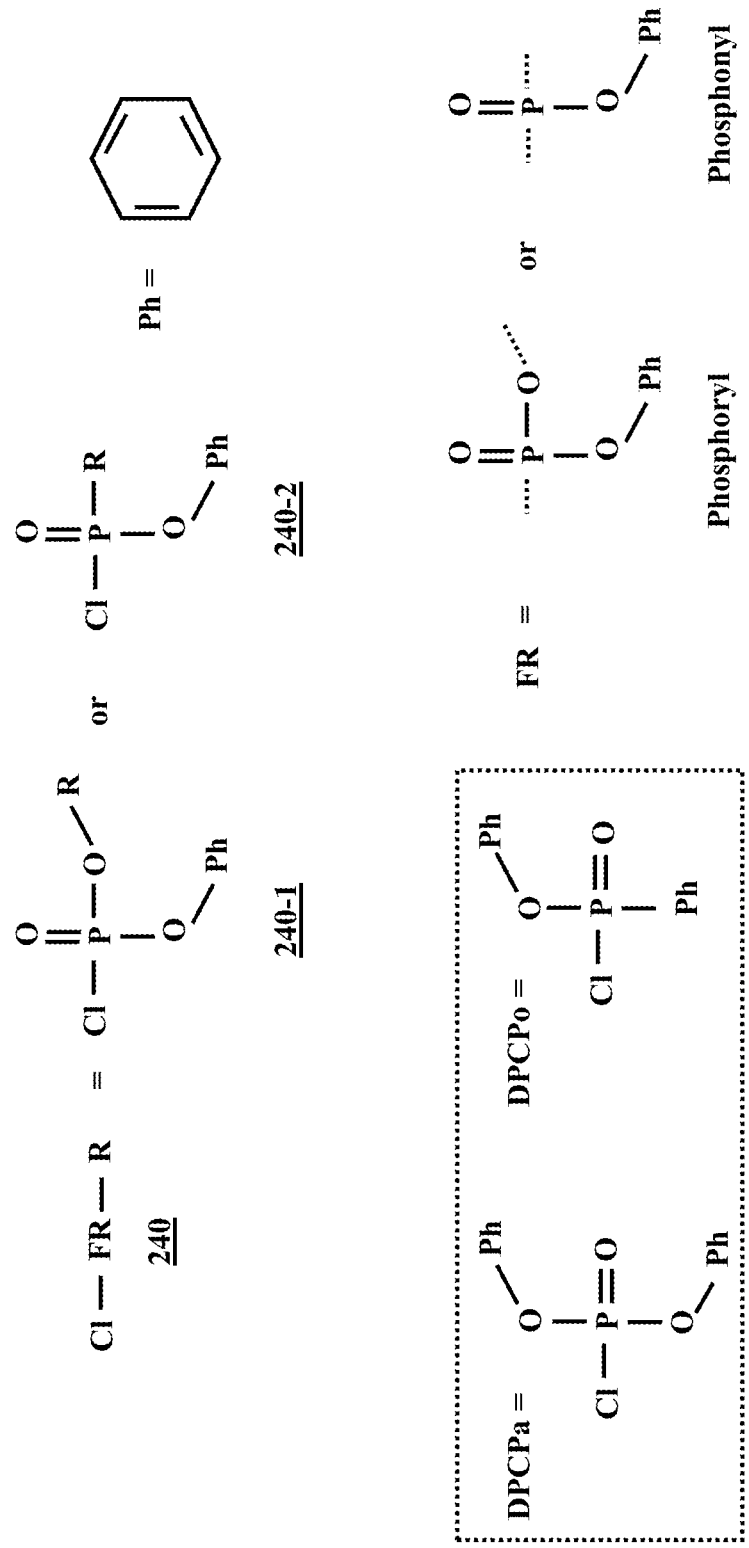
FIG. 2 is a diagrammatic representation of the molecular structures of generic phosphorus-based flame retardant molecules, in accordance with embodiments of the present disclosure.

FIG. 2 is a diagrammatic representation of the molecular structures 202 of R-substituted phosphorus-based flame retardant molecules 240, in accordance with embodiments of the present disclosure. Each phosphorus-based flame retardant molecule 240 is either a phosphate-based flame retardant molecule 240-1 or a phosphonate-based flame retardant molecule 240-2. Herein, phosphoryl and phosphonyl moieties are replaced by the abbreviation "FR" in order to simplify illustrations of the molecular structures. Each phosphorus-based flame retardant molecule 240 has a phenyl (Ph) substituent and an R group. In some examples, the R group can bind to a resin. Further, the molecular structures of diphenyl chlorophosphate (DPCPa) and diphenylphosphinic chloride (DPCPo) are also illustrated in FIG. 2. DPCPa is a phosphate-based flame retardant molecule 240-1, where the R-substitute is a phenyl group. DPCPo is a phosphonate-based flame retardant molecule 240-2, where the R-substitute is a phenyl group. DPCPa and DPCPo may be used in forming various arabitol, xylitol, arabic acid, and xylonic acid derived small molecules and functionalized molecules.

The identities of the R groups bound to the phosphorus-based flame retardant molecules 240 vary, and are discussed in greater detail with respect to FIGS. 3A-3D. Additionally, in some embodiments, the phenyl group is replaced by an alkyl substituent (e.g., methyl, ethyl, propyl, isopropyl, etc.). Further, in some embodiments, the phenyl groups present on diphenyl chlorophosphate (DPCPa) or diphenylphosphinic chloride (DPCPo) may be replaced by similar non-polar functional groups (e.g., methyl, ethyl, propyl, isopropyl, etc.) The syntheses of the phosphorus-based flame retardant molecules 240 are discussed with regard to FIGS. 3A-3D.

Figure 3A:
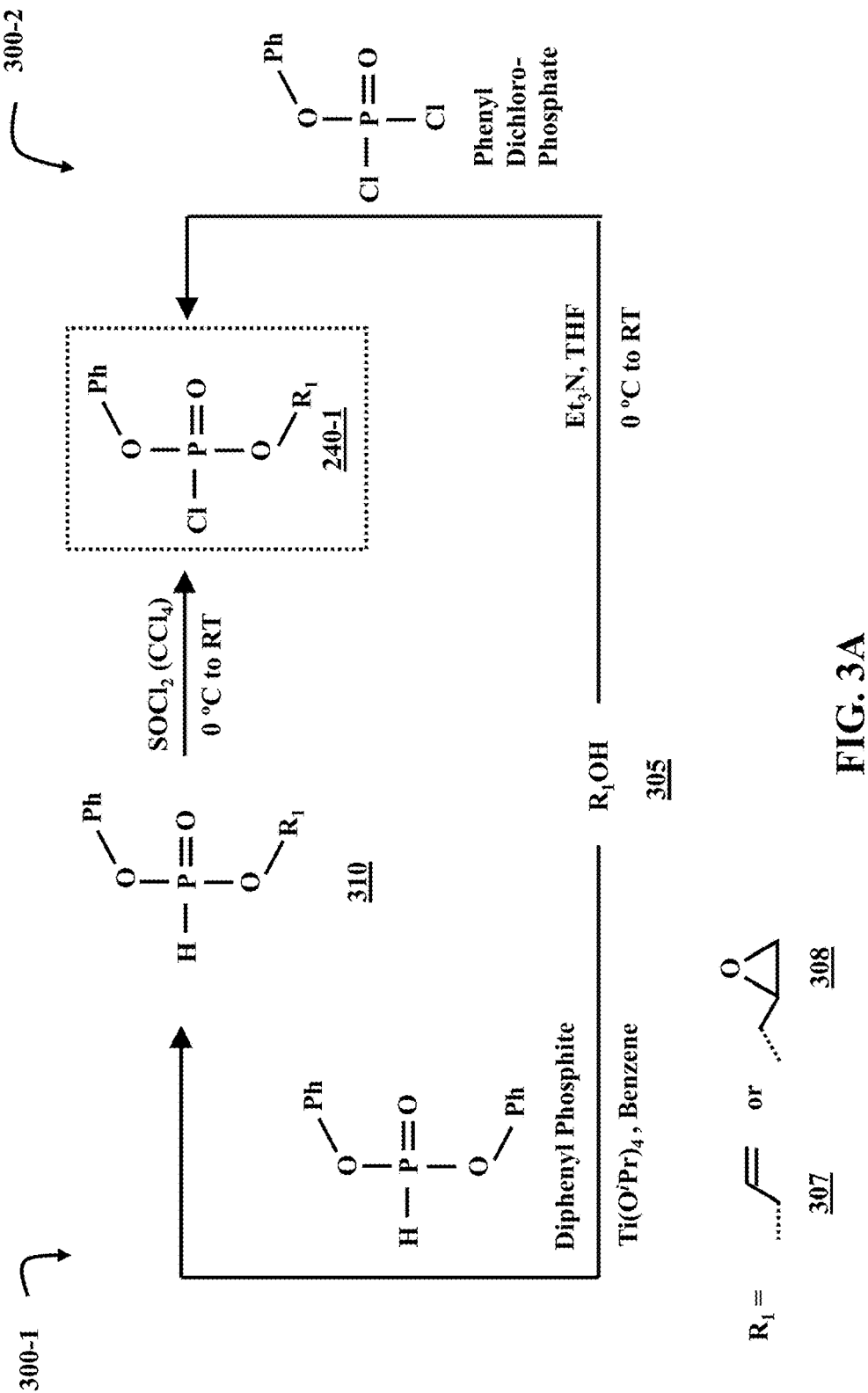
FIG. 3A is a chemical reaction diagram illustrating two processes of synthesizing the phosphate-based flame retardant molecule, in accordance with embodiments of the present disclosure.

FIG. 3A is a chemical reaction diagram illustrating two processes 300-1 and 300-2 of synthesizing the phosphate-based flame retardant molecule 240-1, in accordance with embodiments of the present disclosure. In both processes 300-1 and 300-2, an alcohol 305 is a starting material for the phosphate-based flame retardant molecule 240-1. The alcohol 305 has either an allyl $R_1$ group 307 or an epoxide $R_1$ group 308. It should be noted that, though an allyl group 307 with a single methylene spacer group is illustrated here, other alcohols with allylic chains of varying lengths (e.g., one to twelve methylene spacer groups) could be used. Additionally, alcohols with acrylate substituents are used in some embodiments.

In process 300-1, the alcohol 305 is reacted with diphenyl phosphite and titanium isopropoxide (Ti(O$^i$Pr)$_4$) in benzene to produce a precursor 310 to the phosphate-based flame retardant molecule 240-1. In this pseudo-transesterification reaction, the precursor 310 is formed when a phenyl (Ph) substituent on diphenyl phosphite is replaced by an allyl 307 or epoxide 308 $R_1$ group from the alcohol 305. The precursor 310 is then reacted with thionyl chloride (SOCl$_2$) and carbon tetrachloride (CCl$_4$) over a range of 0° C. to room temperature (RT), forming the phosphate-based flame retardant molecule 240-1.

In process 300-2, the alcohol 305 is reacted with phenyl dichlorophosphate in a tetrahydrofuran (THF) solution containing triethylamine (Et$_3$N). This process is carried out over a range of 0° C. to room temperature (RT). A chloride on the phenyl dichlorophosphate is replaced by the alcohol 305, forming the phosphate-based flame retardant molecule 240-1 with an allyl 307 or epoxide 308 $R_1$ group.

Figure 3B:
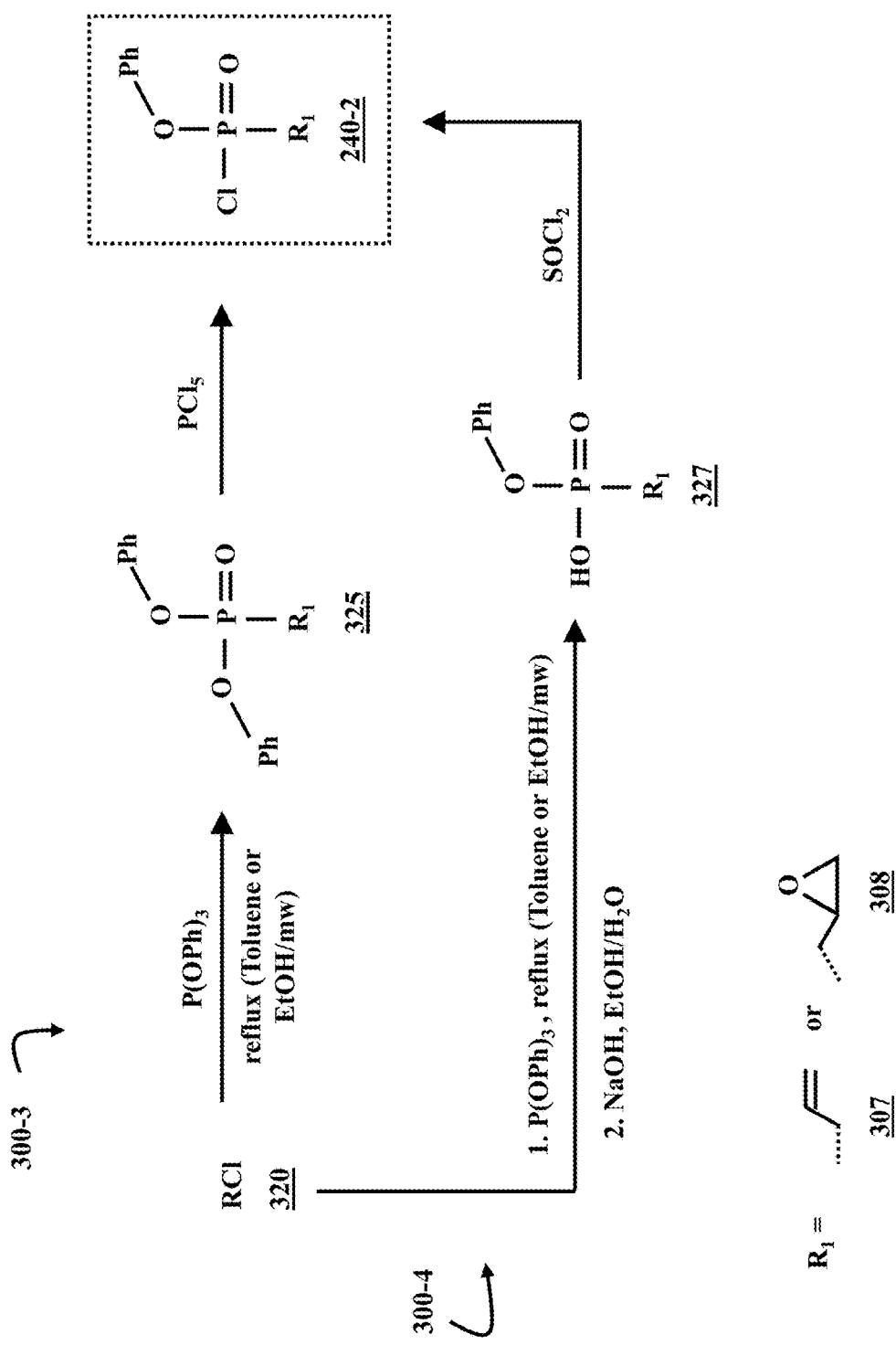
FIG. 3B is a chemical reaction diagram illustrating two processes of synthesizing the phosphonate-based flame retardant molecule, in accordance with embodiments of the present disclosure.

FIG. 3B is a chemical reaction diagram illustrating two processes 300-3 and 300-4 of synthesizing the phosphonate-based flame retardant molecule 240-2, in accordance with embodiments of the present disclosure. In both processes 300-3 and 300-4, an organochloride 320 is a starting material for the phosphonate-based flame retardant molecule 240-2. The organochloride has either an allyl $R_1$ group 307 or an epoxide $R_1$ group 308. It should be noted that, as in the case of the alcohol 305, other organochlorides with allylic chains of varying lengths (e.g., one to twelve methylene spacer groups) could be used. Additionally, organochlorides with acrylate substituents are used in some embodiments.

In process 300-3, the organochloride 320 is reacted with triphenyl phosphite (P(OPh)$_3$). The mixture is heated, either by refluxing in toluene or microwaving (mw) in ethanol (EtOH), producing a phosphonyl ester precursor 325 to the phosphonate-based flame retardant molecule 240-2. The phosphonyl ester precursor 325 is reacted with phosphorus pentachloride (PCl$_5$) to form the phosphonate-based flame retardant molecule 240-2 with an allyl 307 or epoxide 308 R$_1$ group.

In process 300-4, a mixture of the organochloride 320 and triphenyl phosphite (P(OPh)$_3$) is heated, either by refluxing in toluene or microwaving (mw) in ethanol (EtOH), forming a phenylphosphinic acid precursor 327 to the phosphonate-based flame retardant molecule 240-2. The reaction is then quenched by raising the pH of the solution. In this prophetic example, an ethanol (EtOH)/water (H$_2$O) solution of sodium hydroxide (NaOH) is added to the reaction mixture. However, in some embodiments, bases other than sodium hydroxide, such as potassium hydroxide or lithium hydroxide, are used to quench the reaction. When the reaction has been quenched, thionyl chloride (SOCl$_2$) is added to the phenylphosphinic acid precursor 327, producing the phosphonate-based flame retardant molecule 240-2 with an allyl 307 or epoxide 308 R$_1$ group.

Figure 3C:
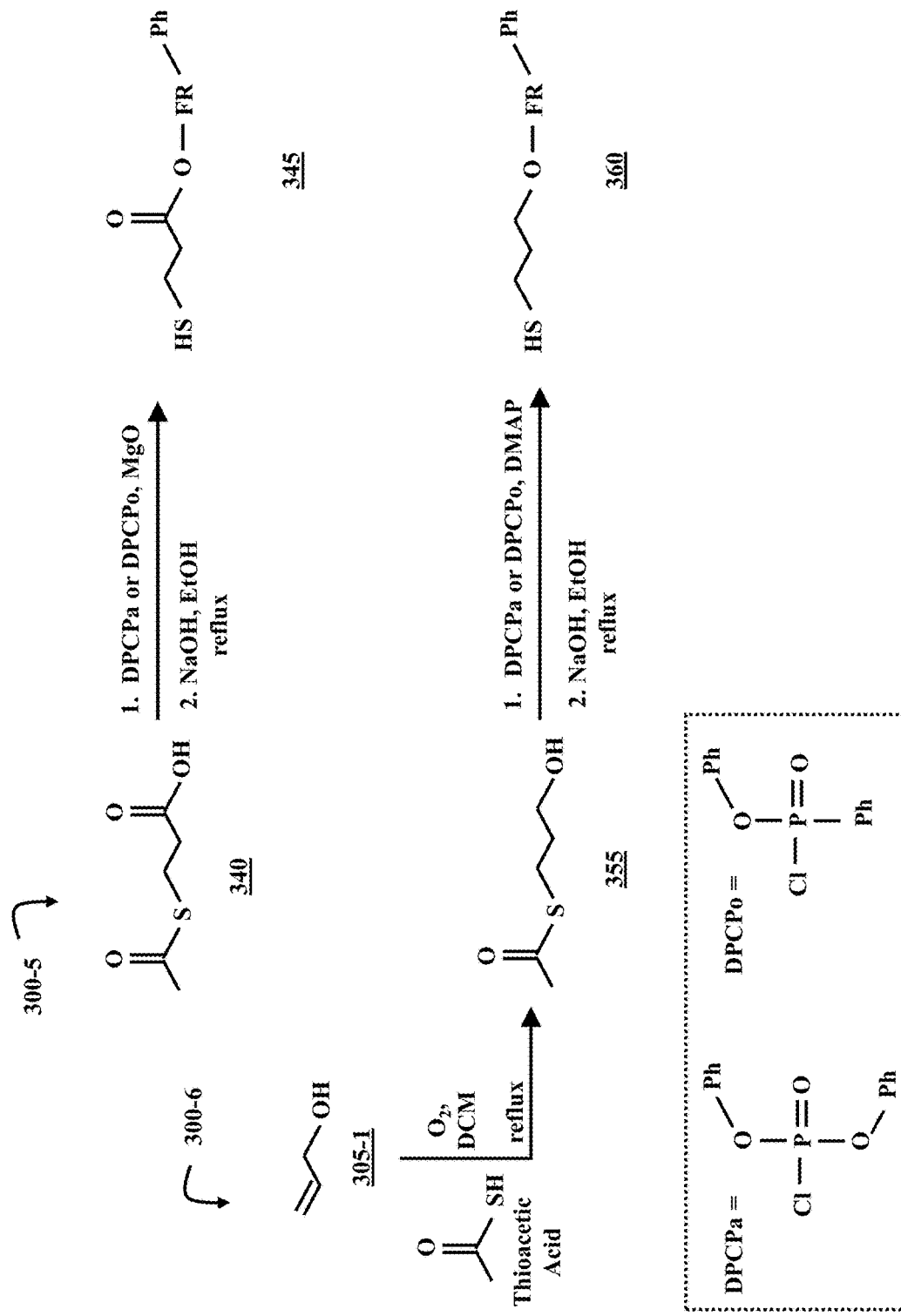
FIG. 3C is a chemical reaction diagram illustrating a process of synthesizing a carboxylic acid-derived flame retardant thiol molecule and a process of synthesizing a hydroxy-derived flame retardant thiol molecule, in accordance with embodiments of the present disclosure.

FIG. 3C is a chemical reaction diagram illustrating a process 300-5 of synthesizing a carboxylic acid-derived flame retardant thiol molecule 345 and a process 300-6 of synthesizing a hydroxy-derived flame retardant thiol molecule 360, in accordance with embodiments of the present disclosure. In process 300-5, acetate-protected thiopropionic acid 340 is reacted with magnesium oxide (MgO) and diphenyl chlorophosphate (DPCPa) or diphenylphosphinic chloride (DPCPo). The acetate group is then removed by refluxing the mixture in an ethanol (EtOH) solution containing sodium hydroxide (NaOH), yielding the carboxylic acid-derived flame retardant thiol molecule 345. If the process is carried out with DPCPa, the carboxylic acid-derived flame retardant thiol molecule 345 will have phosphoryl FR groups, and, if the reaction is carried out with DPCPo, the carboxylic acid-derived flame retardant thiol molecule 345 will have phosphonyl FR groups.

In process 300-6, allyl alcohol 305-1 is reacted with thioacetic acid in a thiol-ene reaction. In the first step of the reaction a dichloromethane (DCM) solution of the allyl alcohol 305-1 and thioacetic acid is sparged with oxygen (O$_2$). The mixture is refluxed, resulting in an acetate-protected mercaptopropanol 355. The second step in the reaction is a substitution reaction involving diphenyl chlorophosphate (DPCPa) and catalytic dimethylaminopyridine (DMAP) or diphenylphosphinic chloride (DPCPo). The acetate group is removed by refluxing the mixture in an ethanol (EtOH) solution containing sodium hydroxide (NaOH). This step results in the production of the hydroxy-derived flame retardant thiol molecule 360. If the process is carried out with DPCPa, the hydroxy-derived flame retardant thiol molecule 360 will have phosphoryl FR groups, and, if the reaction is carried out with DPCPo, the hydroxy-derived flame retardant thiol molecule 360 will have phosphonyl FR groups.

Figure 3D:
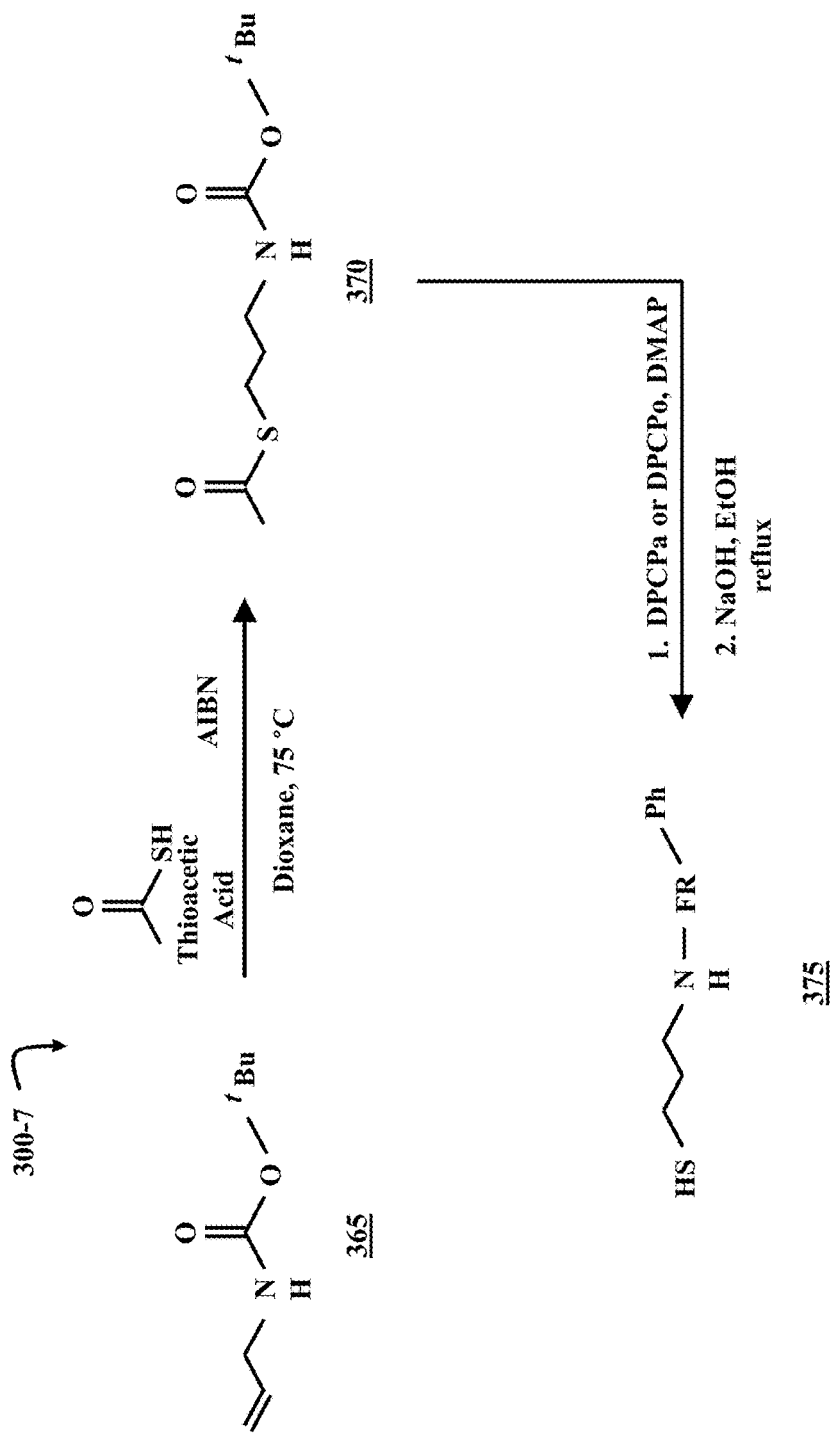
FIG. 3D is a chemical reaction diagram illustrating a process of synthesizing an amino-derived flame retardant thiol molecule, in accordance with embodiments of the present disclosure.

FIG. 3D is a chemical reaction diagram illustrating a process 300-7 of synthesizing an amino-derived flame retardant thiol molecule 375, in accordance with embodiments of the present disclosure. In process 300-7, 1-(boc-amino)-3-butene 365 is first reacted with thioacetic acid in a thiol-ene reaction. Azobisisobutyronitrile (AIBN) is added to the dioxane solution of 1-(boc-amino)-3-butene 365 and thioacetic acid, and the mixture is stirred at 75° C., resulting in an acetate-protected precursor 370 to the amino-derived flame retardant thiol molecule 375. The second step in process 300-7 is a substitution reaction with diphenyl chlorophosphate (DPCPa) or diphenylphosphinic chloride (DPCPo) and catalytic dimethylaminopyridine (DMAP). The acetate group and boc groups are removed under basic conditions (e.g., by refluxing the mixture in an ethanol (EtOH) solution containing sodium hydroxide (NaOH)). This step results in the production of the amino-derived flame retardant thiol molecule 375. If the process is carried out with DPCPa, the amino-derived flame retardant thiol molecule 375 will have phosphoryl FR groups, and, if the reaction is carried out with DPCPo, the amino-derived flame retardant thiol molecule 375 will have phosphonyl FR groups.

Figure 4:
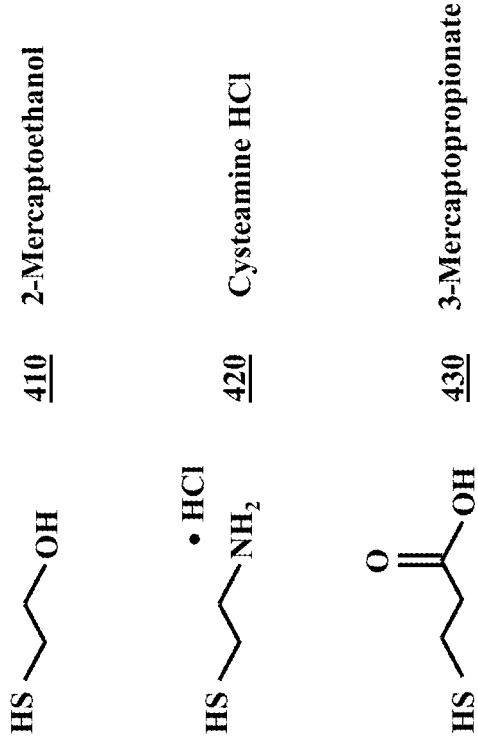
FIG. 4 is a diagrammatic representation of the molecular structures of three thiol molecules that are involved in the synthesis of some examples of the flame retardant arabitol, xylitol, arabic acid, or xylonic acid molecules, in accordance with embodiments of the present disclosure.

FIG. 4 is a diagrammatic representation of the molecular structures of three thiol molecules that are involved in the synthesis of some examples of the flame retardant arabitol, xylitol, arabic acid, and xylonic acid derived molecules, in accordance with embodiments of the present disclosure. The three thiol molecules are 2-mercaptoethanol 410, cysteamine hydrochloride (HCl) 420, and 3-mercaptopropionate 430. Each of these thiols is involved in the synthesis of a thioether-linked flame retardant derivative. In these syntheses, the thiol molecules provide thioether R groups. Details of the syntheses and structures of the thioether-linked flame retardant arabitol, xylitol, arabic acid, and xylonic acid derived molecules are discussed in greater detail with regard to FIGS. 8A-8B.

Figure 5:
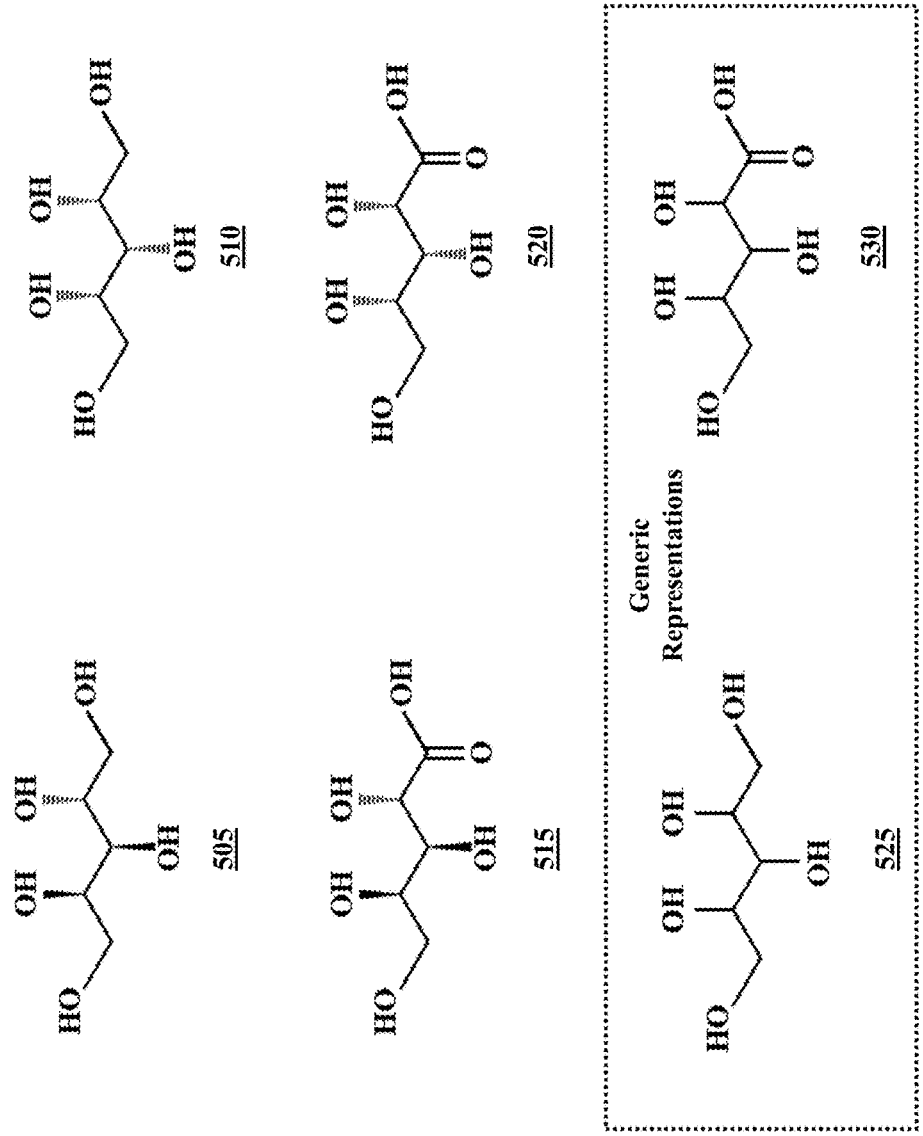
FIG. 5 is a chemical diagram illustrating the molecular structures of arabitol, xylitol, arabic acid, and xylonic acid, in accordance with embodiments of the present disclosure.

FIG. 5 is a chemical diagram illustrating the molecular structures of arabitol 505, xylitol 510, arabic acid 515, and xylonic acid 520, in accordance with embodiments of the present disclosure. The arabitol 505, xylitol 510, arabic acid 515, and xylonic acid 520 molecules can be reacted with phosphate-based flame retardants 240 to form arabitol 505, xylitol 510, arabic acid 515, and xylonic acid 520 derived flame retardants. As depicted in FIG. 5, arabitol 505 and xylitol 510 are diastereomers. Similarly, arabic acid 515 and xylonic acid 520 are diastereomers. For simplicity, arabitol 505 and xylitol 510 are generically represented by pentane-1,2,3,4,5-pentol 525 (herein referred to as "arabitol or xylitol 525"). Arabic acid 515 and xylonic acid 520 are generically represented by 2,3,4,5-tetrahydoxypentanoic acid 530 (herein referred to as "arabic acid or xylonic acid 530").

Figure 6A:
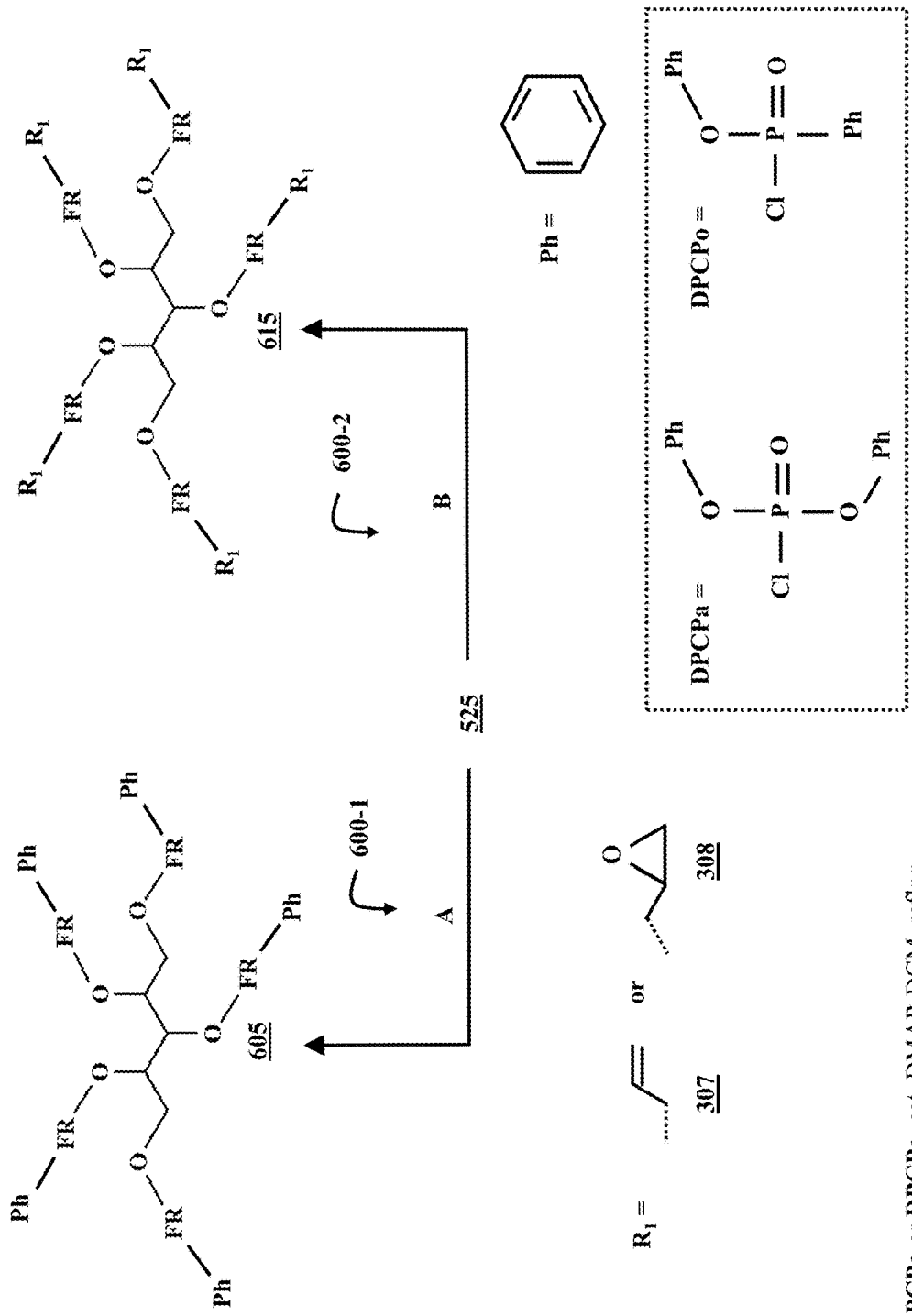
FIG. 6A is a chemical reaction diagram illustrating a process of synthesizing a flame retardant arabitol or xylitol derived small molecule and a process of forming a pentafunctionalized flame retardant arabitol or xylitol compound, in accordance with embodiments of the present disclosure.

FIG. 6A is a chemical reaction diagram illustrating a process 600-1 of synthesizing a flame retardant arabitol or xylitol derived small molecule 605 and a process 600-2 of forming a pentafunctionalized flame retardant arabitol or xylitol compound 615, in accordance with embodiments of the present disclosure. In process 600-1, arabitol or xylitol 525 is reacted with either diphenyl chlorophosphate (DPCPa) or diphenylphosphinic chloride (DPCPo). The mixture is refluxed with catalytic dimethylaminopyridine (DMAP) in a dichloromethane (DCM) solution, producing the flame retardant arabitol or xylitol derived small molecule 605. If the process is carried out with DPCPa, the flame retardant arabitol or xylitol derived small molecule 605 will have phosphoryl FR groups, and, if the reaction is carried out with DPCPo, the flame retardant arabitol or xylitol derived small molecule 605 will have phosphonyl FR groups.

With respect to FIGS. 6-11, reaction with DPCPa yields products having phosphoryl FR groups, and reaction with DPCPo yields products having phosphonyl FR groups.

In process 600-2, arabitol or xylitol 525 is reacted with the phosphorus-based flame retardant molecule 240 and catalytic dimethylaminopyridine (cat. DMAP) in a dichloromethane (DCM) solution, to yield the pentafunctionalized flame retardant arabitol or xylitol compound 615. If arabitol or xylitol 525 is reacted with a phosphorus-based flame retardant molecule 240 having an allyl $R_1$ group 307, the functionalized flame retardant will be an allyl pentafunctionalized flame retardant arabitol or xylitol compound. If arabitol or xylitol 525 is reacted with the phosphorus-based flame retardant molecule 240 having an epoxy $R_1$ group 308, the functionalized flame retardant will be an epoxy pentafunctionalized flame retardant arabitol or xylitol compound.

Figure 6B:
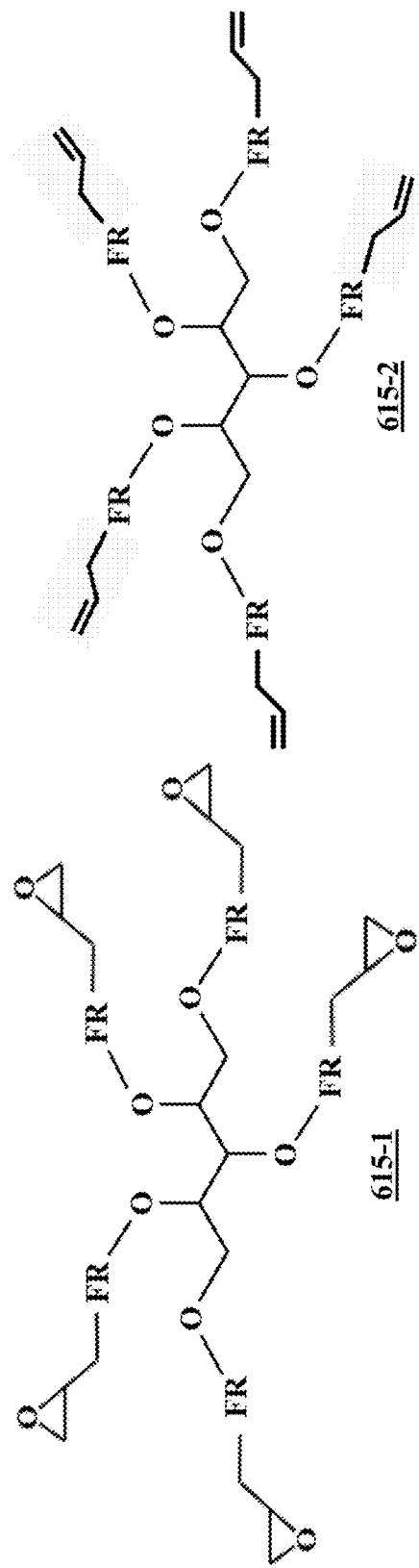
FIG. 6B illustrates an epoxy pentafunctionalized flame retardant arabitol or xylitol compound and an allyl pentafunctionalized flame retardant arabitol or xylitol compound, in accordance with embodiments of the present disclosure.

FIG. 6B illustrates an epoxy pentafunctionalized flame retardant arabitol or xylitol compound 615-1 and an allyl pentafunctionalized flame retardant arabitol or xylitol compound 615-2, in accordance with embodiments of the present disclosure. As mentioned with regard to FIG. 6A, if arabitol or xylitol 525 is reacted with a phosphorus-based flame retardant molecule 240 having an epoxy $R_1$ group 308, the functionalized flame retardant will be the epoxy pentafunctionalized flame retardant arabitol or xylitol compound 615-1. If arabitol or xylitol 525 is reacted with a phosphorus-based flame retardant molecule 240 having an allyl $R_1$ group 307, the functionalized flame retardant will be the allyl pentafunctionalized flame retardant arabitol or xylitol compound 615-2.

Figure 6C:
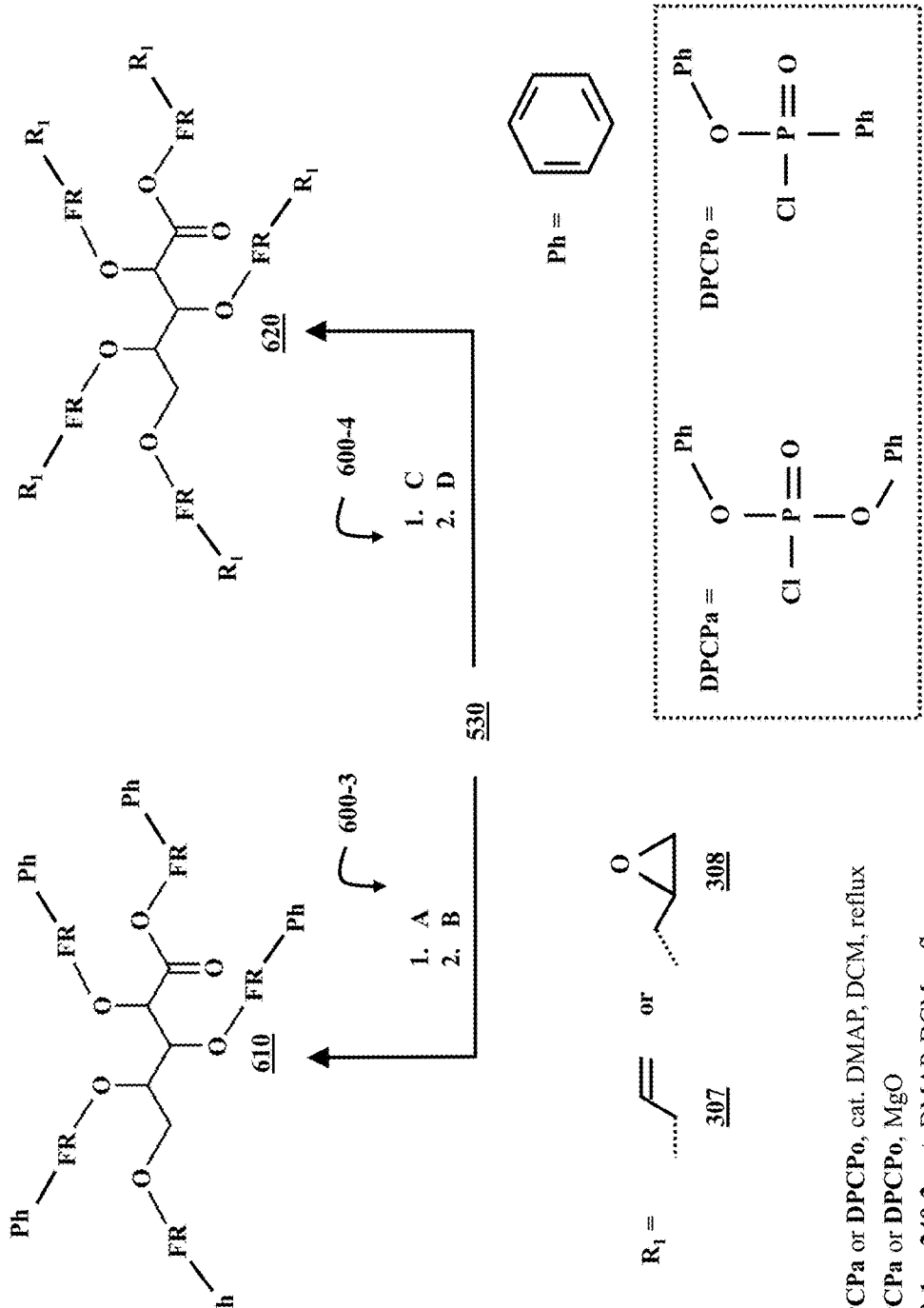
FIG. 6C is a chemical reaction diagram illustrating a process of synthesizing a flame retardant arabic acid or xylonic acid derived small molecule and a process of forming a pentafunctionalized flame retardant arabic acid or xylonic acid compound, in accordance with embodiments of the present disclosure.

FIG. 6C is a chemical reaction diagram illustrating a process 600-3 of synthesizing a flame retardant arabic acid or xylonic acid derived small molecule 610 and a process 600-4 of forming a pentafunctionalized flame retardant arabic acid or xylonic acid compound 620, in accordance with embodiments of the present disclosure. In process 600-3, arabic acid or xylonic acid 530 is reacted with either diphenyl chlorophosphate (DPCPa) or diphenylphosphinic chloride (DPCPo). The mixture is refluxed with catalytic dimethylaminopyridine (DMAP) in a dichloromethane (DCM) solution. The resulting mixture is reacted with either diphenyl chlorophosphate (DPCPa) or diphenylphosphinic chloride (DPCPo) and magnesium oxide (MgO), producing the flame retardant arabic acid or xylonic acid derived small molecule 610.

In process 600-4, arabic acid or xylonic acid 530 is reacted with a phosphorus-based flame retardant molecule 240 and catalytic dimethylaminopyridine (DMAP) in a dichloromethane (DCM) solution, and the resulting mixture is reacted with a phosphorus-based flame retardant molecule 240 and magnesium oxide (MgO), to yield the pentafunctionalized flame retardant arabic acid or xylonic acid compound 620. If arabic acid or xylonic acid 530 is reacted with a phosphorus-based flame retardant molecule 240 having an allyl $R_1$ group 307, the functionalized flame retardant will be an allyl pentafunctionalized flame retardant arabic acid or xylonic acid compound. If arabic acid or xylonic acid 530 is reacted with a phosphorus-based flame retardant molecule 240 having an epoxy $R_1$ group 308, the functionalized flame retardant will be an epoxy pentafunctionalized flame retardant arabic acid or xylonic acid compound.

Figure 6D:
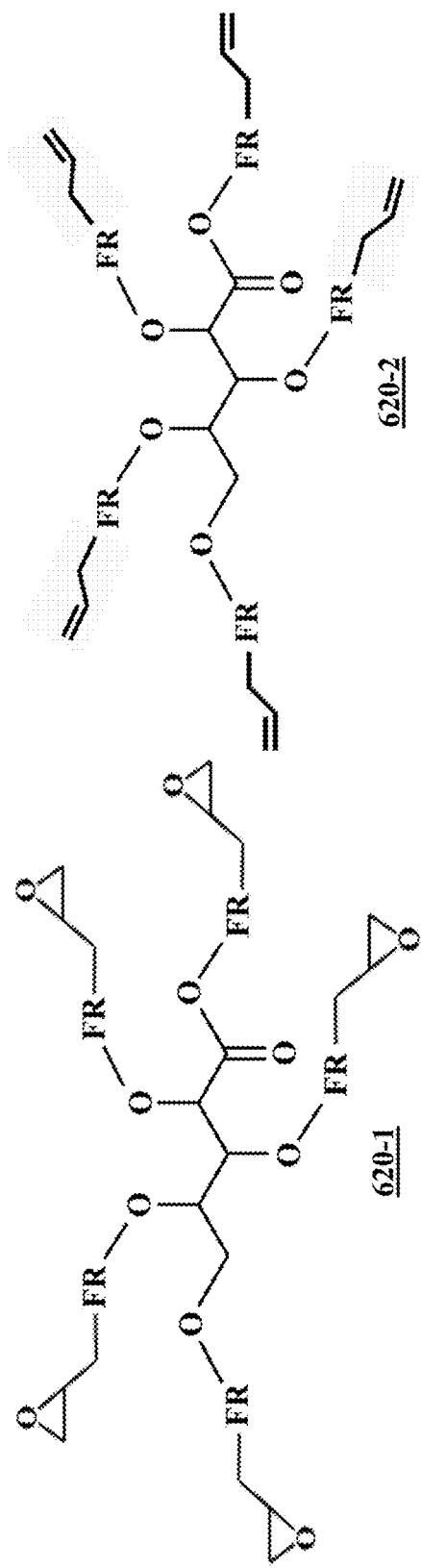
FIG. 6D illustrates an epoxy pentafunctionalized flame retardant arabic acid or xylonic acid compound and an allyl pentafunctionalized flame retardant arabic acid or xylonic acid compound, in accordance with embodiments of the present disclosure.

FIG. 6D illustrates an epoxy pentafunctionalized flame retardant arabic acid or xylonic acid compound 620-1 and an allyl pentafunctionalized flame retardant arabic acid or xylonic acid compound 620-2, in accordance with embodiments of the present disclosure. As mentioned with regard to FIG. 6C, if arabic acid or xylonic acid 530 is reacted with a phosphorus-based flame retardant molecule 240 having an epoxy $R_1$ group 308, the functionalized flame retardant will be the epoxy pentafunctionalized flame retardant arabic acid or xylonic acid compound 620-1. If arabic acid or xylonic acid 530 is reacted with a phosphorus-based flame retardant molecule 240 having an allyl $R_1$ group 307, the functionalized flame retardant will be the allyl pentafunctionalized flame retardant arabic acid or xylonic acid compound 620-2.

Figure 7A:
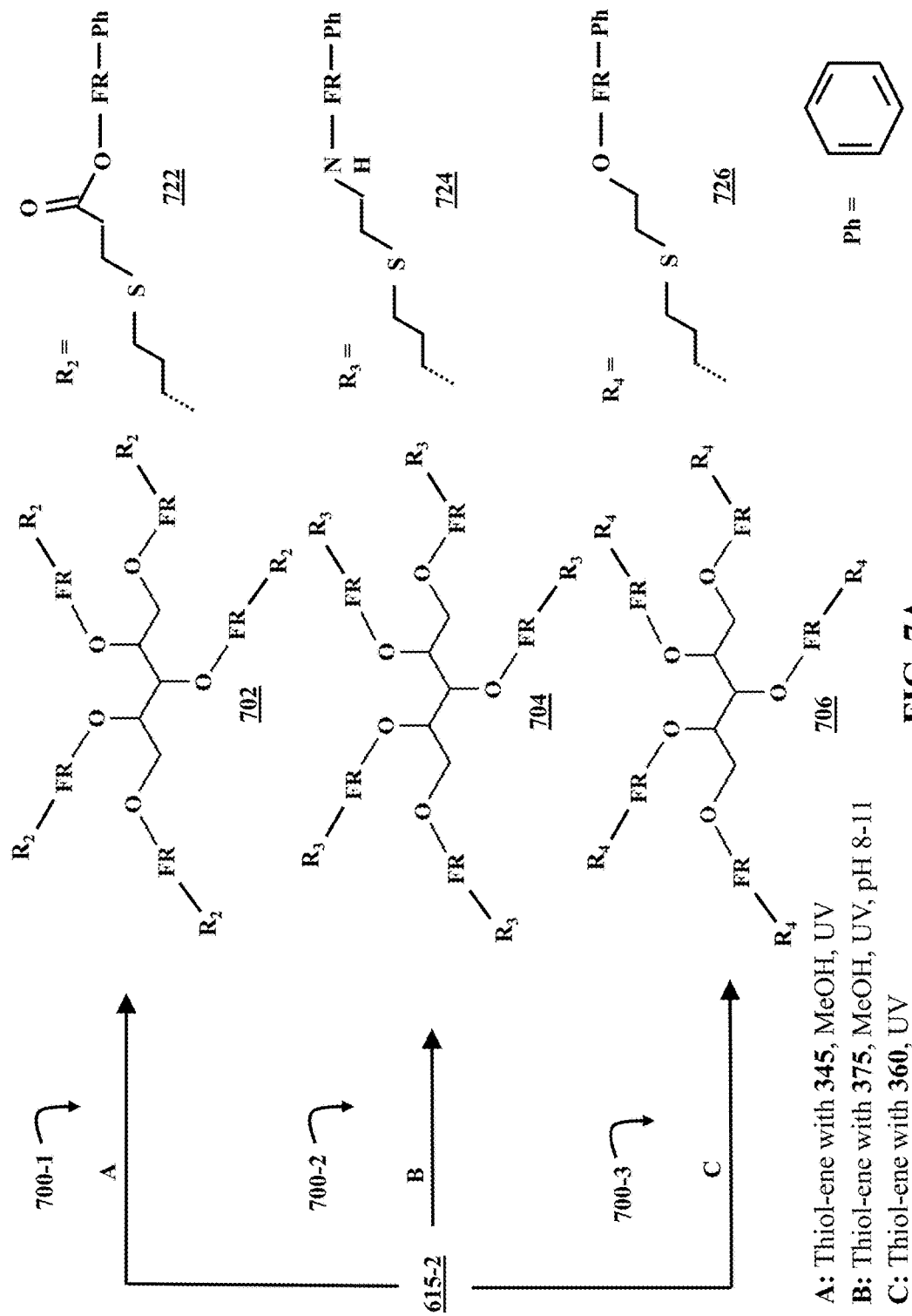
FIG. 7A is a chemical reaction diagram illustrating three processes of synthesizing thioether-linked flame retardant arabitol or xylitol small molecules, in accordance with embodiments of the present disclosure.

FIG. 7A is a chemical reaction diagram illustrating three processes 700-1, 700-2, and 700-3 of synthesizing thioether-linked flame retardant arabitol or xylitol small molecules, in accordance with embodiments of the present disclosure. Each process is a thiol-ene reaction between the allyl pentafunctionalized flame retardant arabitol or xylitol compound 615-2 and a flame retardant thiol molecule 345, 360, or 375. The syntheses and structures of the flame retardant thiol molecules are discussed in greater detail with regard to FIGS. 3C and 3D.

In process 700-1, the allyl pentafunctionalized flame retardant arabitol or xylitol compound 615-2 is reacted with the carboxylic acid-derived flame retardant thiol molecule 345 under UV light (e.g., light with a wavelength of approximately 100-400 nm) in a methanol (MeOH) solution. The resulting thioether-linked flame retardant arabitol or xylitol derived small molecule 702 has a thioether $R_2$ group 722 that corresponds to the carboxylic acid-derived flame retardant thiol molecule 345. In process 700-2, the allyl pentafunctionalized flame retardant arabitol or xylitol compound 615-2 is reacted with the amino-derived flame retardant thiol molecule 375 in a methanol (MeOH) solution with a pH of approximately 8-11 under UV light. The resulting thioether-linked flame retardant arabitol or xylitol derived small molecule 704 has a thioether $R_3$ group 724 that corresponds to the amino-derived flame retardant thiol molecule 375. In process 700-3, the allyl pentafunctionalized flame retardant arabitol or xylitol compound 615-2 is reacted with the hydroxy-derived flame retardant thiol molecule 360 under UV light. The resulting thioether-linked flame retardant arabitol or xylitol derived small molecule 706 has a thioether $R_4$ group 726 that corresponds to the hydroxy-derived flame retardant thiol molecule 360.

Figure 7B:
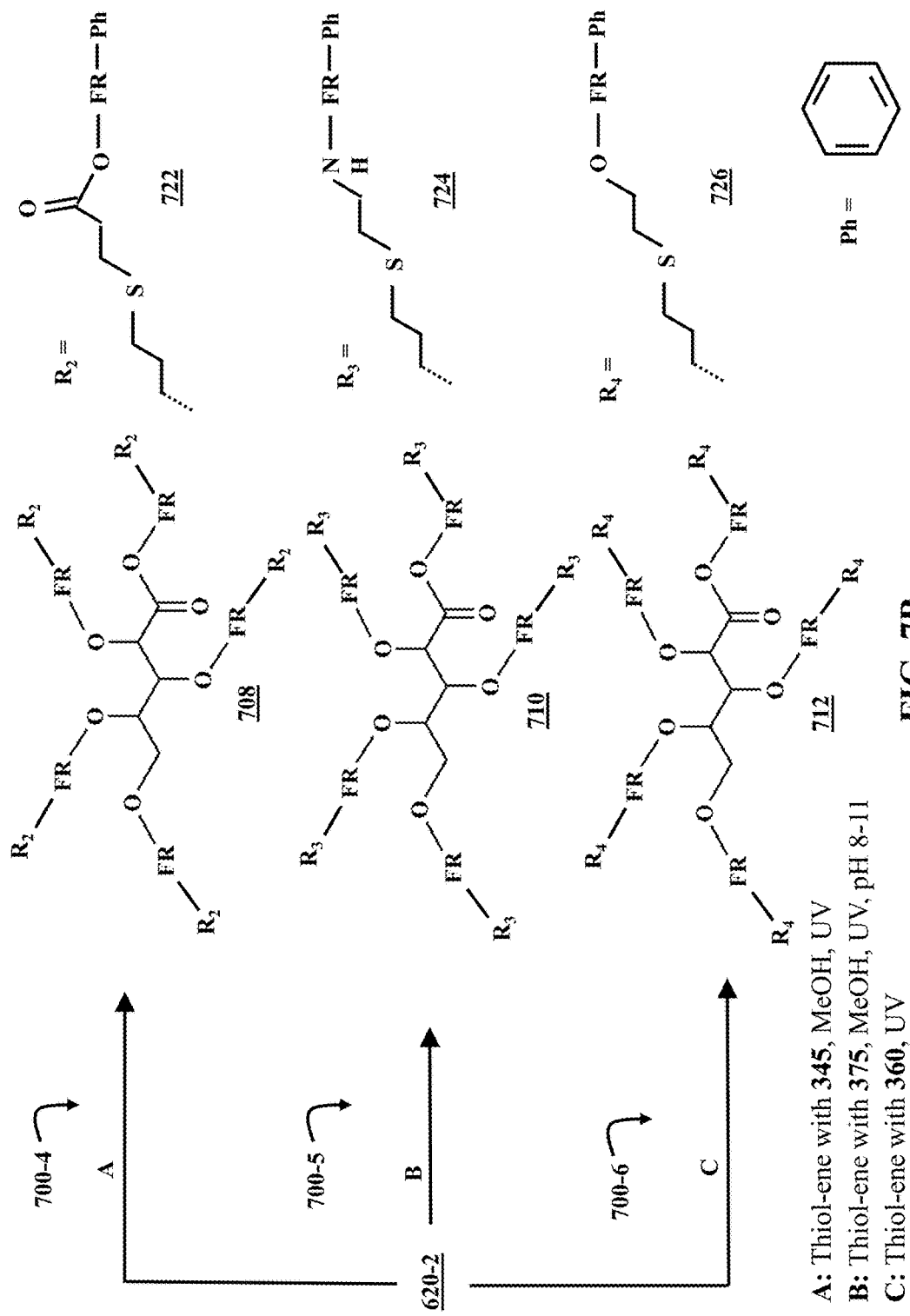
FIG. 7B is a chemical reaction diagram illustrating three of synthesizing thioether-linked flame retardant arabic acid and xylonic acid derived small molecules, in accordance with embodiments of the present disclosure.

FIG. 7B is a chemical reaction diagram illustrating three processes 700-4, 700-5, and 700-6 of synthesizing thioether-linked flame retardant arabic acid and xylonic acid derived small molecules, in accordance with embodiments of the present disclosure. Each process is a thiol-ene reaction between the allyl pentafunctionalized flame retardant arabic acid and xylonic acid compound 620-2 and a flame retardant thiol molecule 345, 360, or 375. The syntheses and structures of the flame retardant thiol molecules are discussed in greater detail with regard to FIGS. 3C and 3D.

In process 700-4, the allyl pentafunctionalized flame retardant arabic acid and xylonic acid compound 620-2 is reacted with the carboxylic acid-derived flame retardant thiol molecule 345 under UV light in a methanol (MeOH) solution. The resulting thioether-linked flame retardant arabic acid or xylonic acid small molecule 708 has a thioether $R_2$ group 722 that corresponds to the carboxylic acid-derived flame retardant thiol molecule 345. In process 700-5, the allyl pentafunctionalized flame retardant arabic acid and xylonic acid compound 620-2 is reacted with the amino-derived flame retardant thiol molecule 375 in a methanol (MeOH) solution with a pH of approximately 8-11 under UV light. The resulting thioether-linked flame retardant arabic acid or xylonic acid derived small molecule 710 has a thioether $R_3$ group 724 that corresponds to the amino-derived flame retardant thiol molecule 375. In process 700-6, the allyl pentafunctionalized flame retardant arabic acid and xylonic acid compound 620-2 is reacted with the hydroxy-derived flame retardant thiol molecule 360 under UV light. The resulting thioether-linked flame retardant arabic acid or xylonic acid small molecule 706 has a thioether $R_4$ group 726 that corresponds to the hydroxy-derived flame retardant thiol molecule 360.

Figure 8A:
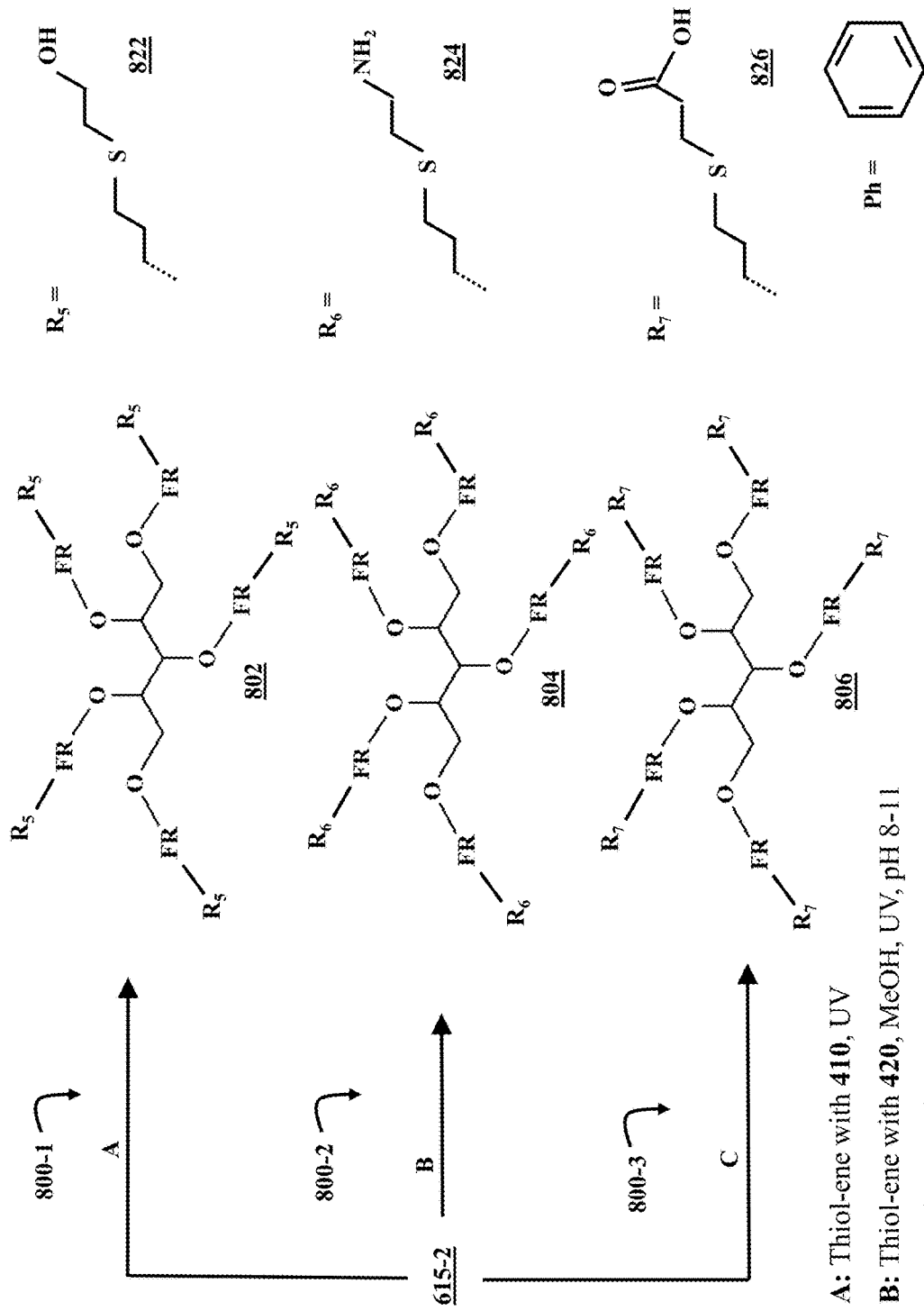
FIG. 8A is a chemical reaction diagram illustrating three processes of synthesizing thioether-linked flame retardant arabitol or xylitol compounds, in accordance with embodiments of the present disclosure.

FIG. 8A is a chemical reaction diagram illustrating three processes 800-1, 800-2, and 800-3 of synthesizing thioether-linked flame retardant arabitol or xylitol compounds, in accordance with embodiments of the present disclosure. Each process is a thiol-ene reaction between the allyl pentafunctionalized flame retardant arabitol or xylitol compound 615-2 and a thiol molecule. The thiol molecules used in processes 800-1, 800-2, and 800-3 are 2-mercaptoethanol 410, cysteamine HCl 420, and 3-mercaptopropionate 430, respectively. The structures of these thiol molecules are illustrated in FIG. 4.

In process 800-1 the allyl pentafunctionalized flame retardant arabitol or xylitol compound 615-2 is reacted with 2-mercaptoethanol 410 under UV light. The resulting hydroxyl-functionalized flame retardant arabitol or xylitol derived compound 802 has thioether $R_5$ groups 822 that correspond to 2-mercaptoethanol 410. In process 800-2 the allyl pentafunctionalized flame retardant arabitol or xylitol compound 615-2 is reacted with cysteamine HCl 420 in a pH of approximately 8-11 methanol (MeOH) solution under UV light. The resulting amino pentafunctionalized flame retardant arabitol or xylitol derived compound 804 has thioether $R_6$ groups 824 that correspond to cysteamine HCl 420. In process 800-3 the allyl pentafunctionalized flame retardant arabitol or xylitol compound 615-2 is reacted with 2-mercaptopropionate 430 under UV light in a methanol (MeOH) solution. The resulting carboxylic acid-functionalized flame retardant arabitol or xylitol derived compound 806 has thioether $R_7$ groups 826 that correspond to 3-mercaptopropionate 430.

Figure 8B:
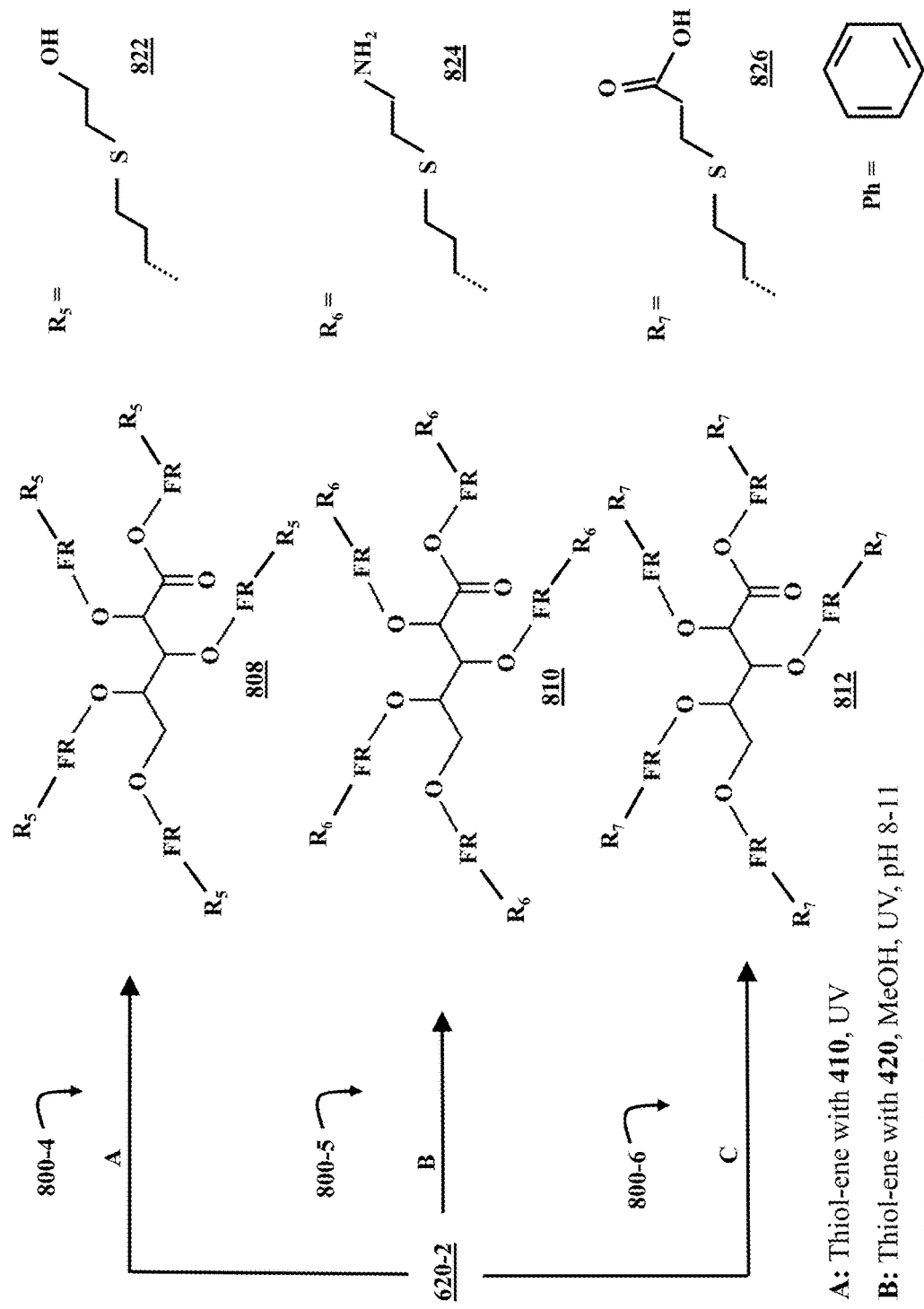
FIG. 8B is a chemical reaction diagram illustrating three processes of synthesizing thioether-linked flame retardant arabic acid or xylonic acid derived compounds, in accordance with embodiments of the present disclosure.

FIG. 8B is a chemical reaction diagram illustrating three processes 800-4, 800-5, and 800-6 of synthesizing thioether-linked flame retardant arabic acid or xylonic acid derived compounds, in accordance with embodiments of the present disclosure. Each process is a thiol-ene reaction between the allyl pentafunctionalized flame retardant arabic acid or xylonic acid compound 620-2 and a thiol molecule. The thiol molecules used in processes 800-4, 800-5, and 800-6 are 2-mercaptoethanol 410, cysteamine HCl 420, and 3-mercaptopropionate 430, respectively. The structures of these thiol molecules are illustrated in FIG. 4.

In process 800-4, the allyl pentafunctionalized flame retardant arabic acid or xylonic acid compound 620-2 is reacted with 2-mercaptoethanol 410 under UV light. The resulting hydroxyl-functionalized flame retardant arabic acid or xylonic acid derived compound 808 has thioether $R_5$ groups 822 that correspond to 2-mercaptoethanol 410. In process 800-5 the allyl pentafunctionalized flame retardant arabic acid or xylonic acid compound 620-2 is reacted with cysteamine HCl 420 in a pH of approximately 8-11 methanol (MeOH) solution under UV light. The resulting amino-functionalized flame retardant arabic acid or xylonic acid derived compound 810 has thioether $R_6$ groups 824 that correspond to cysteamine HCl 420. In process 800-6, the allyl pentafunctionalized flame retardant arabic acid or xylonic acid compound 620-2 is reacted with 2-mercaptopropionate 430 under UV light in a methanol (MeOH) solution. The resulting carboxylic acid-functionalized flame retardant arabic acid or xylonic acid derived compound 812 has thioether $R_7$ groups 826 that correspond to 3-mercaptopropionate 430.

Figure 8C:
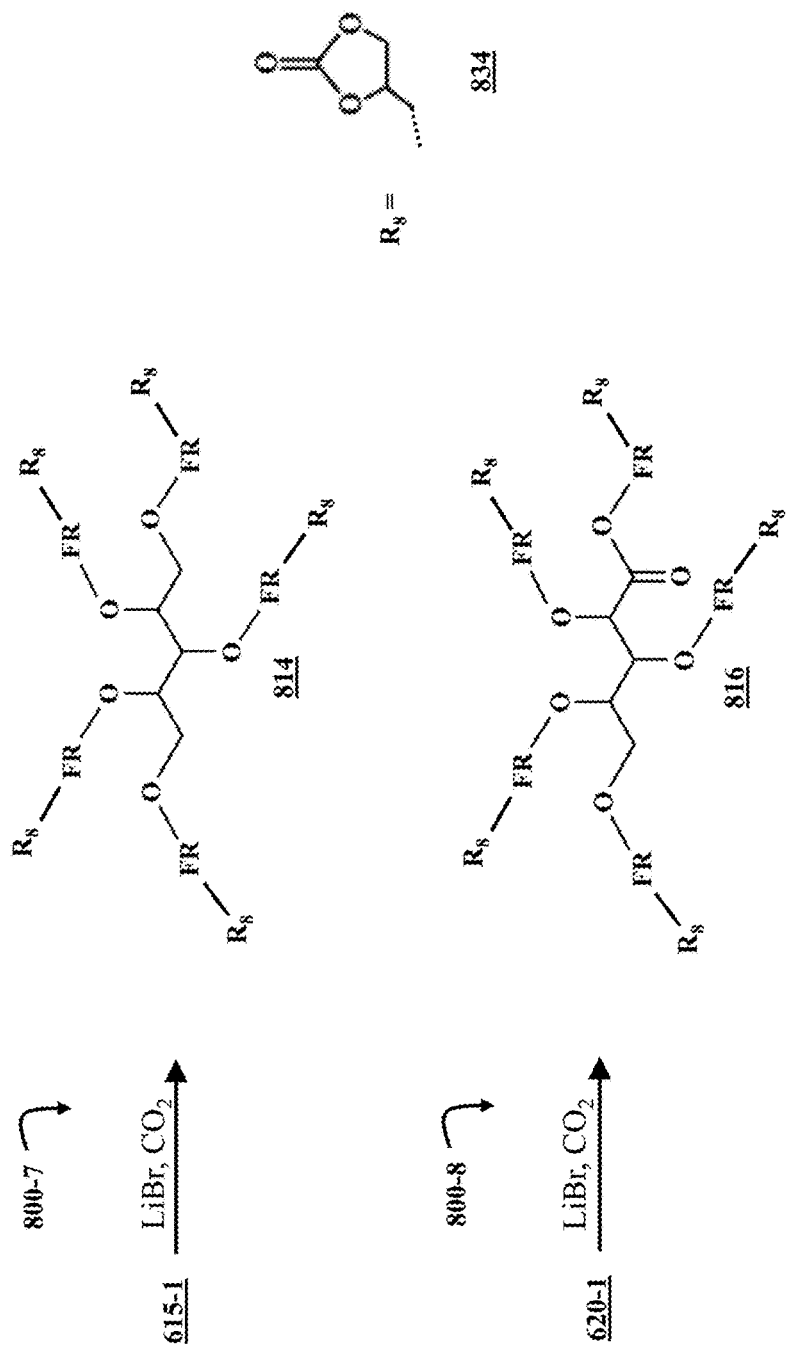
FIG. 8C is a chemical reaction diagram illustrating two processes of synthesizing a propylene carbonate pentafunctionalized flame retardant arabitol or xylitol derived compound and a propylene carbonate pentafunctionalized flame retardant arabic acid or xylonic acid derived compound, in accordance with embodiments of the present disclosure.

FIG. 8C is a chemical reaction diagram illustrating processes 800-7 and 800-8 of synthesizing a propylene carbonate pentafunctionalized flame retardant arabitol or xylitol derived compound 814 and a propylene carbonate penta-functionalized flame retardant arabic acid or xylonic acid derived compound 816, in accordance with embodiments of the present disclosure. In process 800-7 the epoxy pentafunctionalized flame retardant arabitol or xylitol compound 615-1 is combined with lithium bromide (LiBr). Carbon dioxide ($CO_2$) is added to the mixture, either by injecting into the headspace of the reaction flask, or by bubbling through the solution. This step yields the propylene carbonate pentafunctionalized flame retardant arabitol or xylitol compound 814 with a propylene carbonate $R_8$ functional group 834. In process 800-8 the epoxy pentafunctionalized flame retardant arabic acid or xylonic acid compound 620-1 is combined with lithium bromide (LiBr). Carbon dioxide ($CO_2$) is added to the mixture, either by injecting into the headspace of the reaction flask, or by bubbling through the solution. This step yields the propylene carbonate pentafunctionalized flame retardant arabic acid or xylonic acid derived compound 816 with a propylene carbonate $R_8$ functional group 834.

Figure 9:
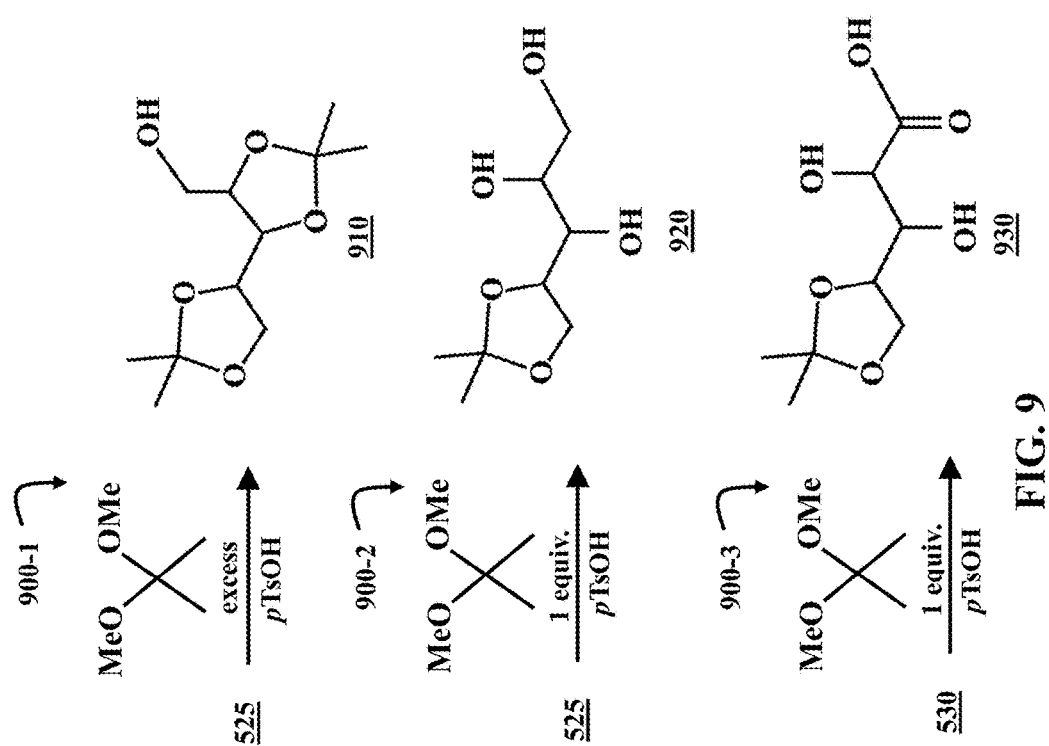
FIG. 9 is a chemical reaction diagram illustrating three processes of forming tetra-protected arabitol or xylitol, di-protected arabitol or xylitol, and di-protected arabic acid or xylonic acid, respectively, in accordance with embodiments of the present disclosure.

FIG. 9 is a chemical reaction diagram illustrating three processes 900-1, 900-2, and 900-3 of forming tetra-protected arabitol or xylitol 910, di-protected arabitol or xylitol 920, and di-protected arabic acid or xylonic acid 930, respectively, in accordance with embodiments of the present disclosure. In process 900-1, arabitol or xylitol 525 is reacted with excess 2,2-dimethoxypropane in a p-toluenesulfonic acid (p-TsOH) solution, yielding the tetra-protected arabitol or xylitol 910. In process 900-2, arabitol or xylitol 525 is reacted with one equivalent (1 equiv.) 2,2-dimethoxypropane in a p-toluenesulfonic acid (p-TsOH) solution, yielding the di-protected arabitol or xylitol 920. In process 900-3, arabic acid or xylonic acid 530 is reacted with one equivalent (1 equiv.) 2,2-dimethoxypropane in a p-toluenesulfonic acid (p-TsOH) solution, yielding the di-protected arabic acid or xylonic acid 930.

The tetra-protected arabitol or xylitol 910, di-protected arabitol or xylitol 920, and di-protected arabic acid or xylonic acid 930 can be used to form various flame retardant functionalized (e.g., mono-, di-, tri-, tetra-) molecules. Specifically, protecting hydroxyl groups on the arabitol, xylitol, arabic acid, and xylonic acid molecules allows remaining hydroxyl groups to freely react, allowing variation in the degree of functionalization (e.g., mono-functionalization vs. penta-functionalization). The synthesis of these multi-functionalized flame retardant molecules is discussed in greater detail with respect to FIGS. 10-11.

With respect to FIGS. 10-11, if the phosphorus-based flame retardant molecule 240 having an allyl $R_1$ group 307 is selected for reaction, the functionalized flame retardant will be an allyl functionalized flame retardant (e.g., $R_1$ as shown on FIGS. 10-11 will be an allyl functional group 307). If the phosphorus-based flame retardant molecule 240 having an epoxy $R_1$ group 308 is selected for reaction, the functionalized flame retardant will be an epoxy functionalized flame retardant (e.g., $R_1$ as shown on FIGS. 10-11 will be an epoxy functional group 308).

Further, deprotection, as illustrated in FIGS. 10-11, refers to eliminating protection groups present on the various protected molecules. Deprotecting conditions can vary. Deprotection can include mixing protected polyols and monoacids in acetone solutions, p-toluenesulfonic acid (p-TsOH) solutions, or hydrochloric acid (HCl) solutions. For example, a polyol or monoacid can be deprotected at approximately pH 7 in the presence of acetone with indium (III) trifluoromethanesulfonate as a catalyst at room temperature. Deprotection can also be achieved by using a catalytic amount of sodium tetrakis (3,5-trifluoromethylphenyl) borate (NaBArF₄) (e.g., 0.1 molar % NaBArF₄) in water at 30° C. Alternatively, deprotection can be achieved by using a catalytic amount of erbium(III) trifluoromethanesulfonate) (Er(OTf)₃) (e.g., 1-5 molar % Er(OTf)₃) at room temperature in nitromethane. Deprotection can also be achieved by using a catalytic amount of cerium(III) triflate (Ce(OTf)₃) (5-30 molar % Ce(OTf)₃) at room temperature in nitromethane. Deprotection can also be achieved at approximately pH 7 in the presence of a catalytic amount of iodine (I₂) in an acetone solution at 25° C.

Figure 10A:
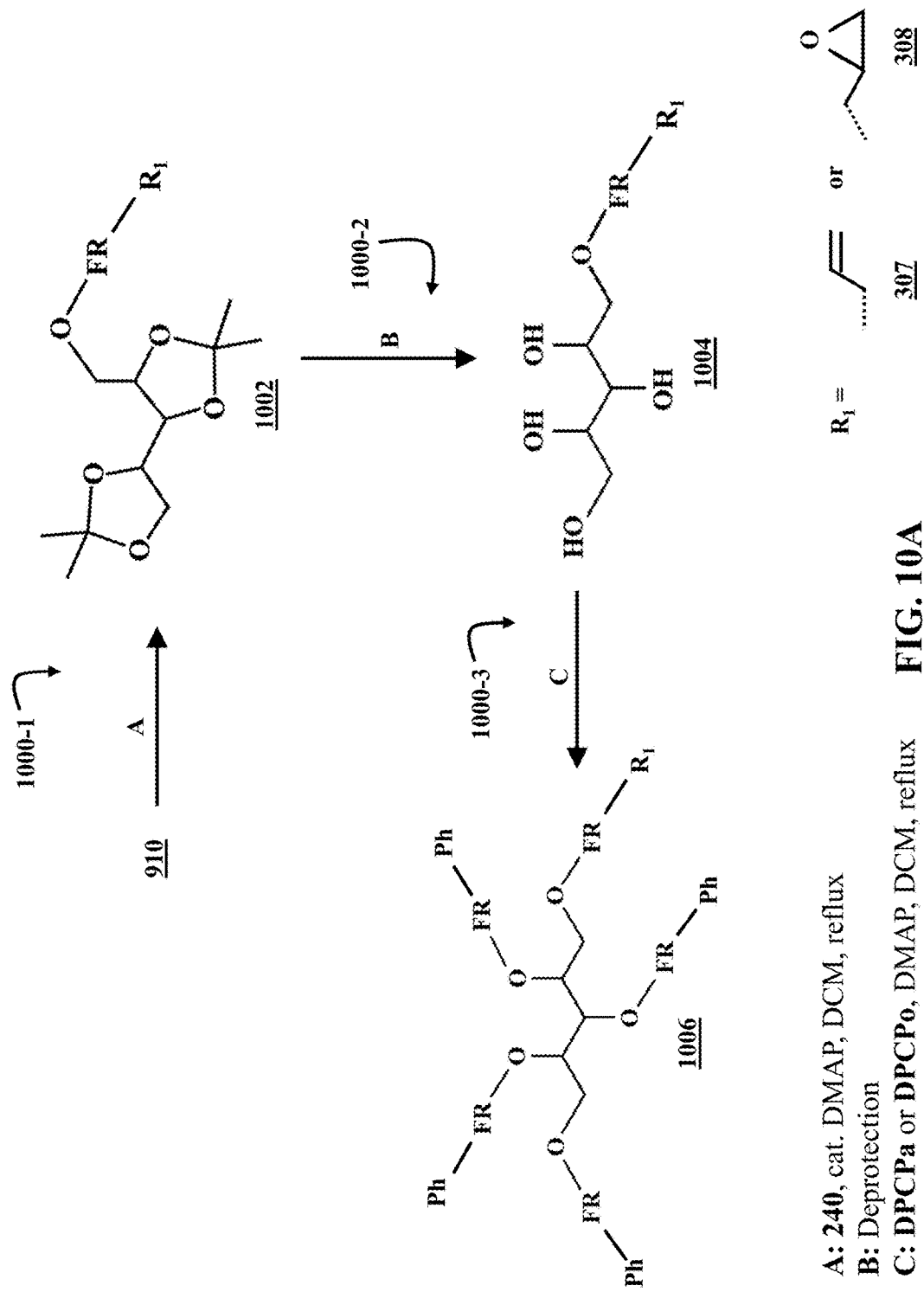
FIG. 10A is a chemical reaction diagram illustrating three processes collectively used to synthesize a monofunctionalized flame retardant arabitol or xylitol molecule, in accordance with embodiments of the present disclosure.

FIG. 10A is a chemical reaction diagram illustrating three processes 1000-1, 1000-2, and 1000-3 collectively used to synthesize a monofunctionalized flame retardant arabitol or xylitol molecule 1006, in accordance with embodiments of the present disclosure. In process 1000-1, tetra-protected arabitol or xylitol 910 is reacted with the phosphorus-based flame retardant molecule 240 and catalytic dimethylaminopyridine (DMAP) in a dichloromethane (DCM) solution, yielding a tetra-protected monofunctionalized flame retardant arabitol or xylitol molecule 1002. In process 1000-2, the tetra-protected monofunctionalized flame retardant arabitol or xylitol molecule 1002 is deprotected, yielding a monofunctionalized flame retardant arabitol or xylitol precursor 1004. In process 1000-3, the monofunctionalized flame retardant arabitol or xylitol precursor 1004 is reacted with either diphenyl chlorophosphate (DPCPa) or diphenylphosphinic chloride (DPCPo). The mixture is refluxed with catalytic dimethylaminopyridine (DMAP) in a dichloromethane (DCM) solution, yielding the monofunctionalized flame retardant arabitol or xylitol molecule 1006.

Figure 10B:
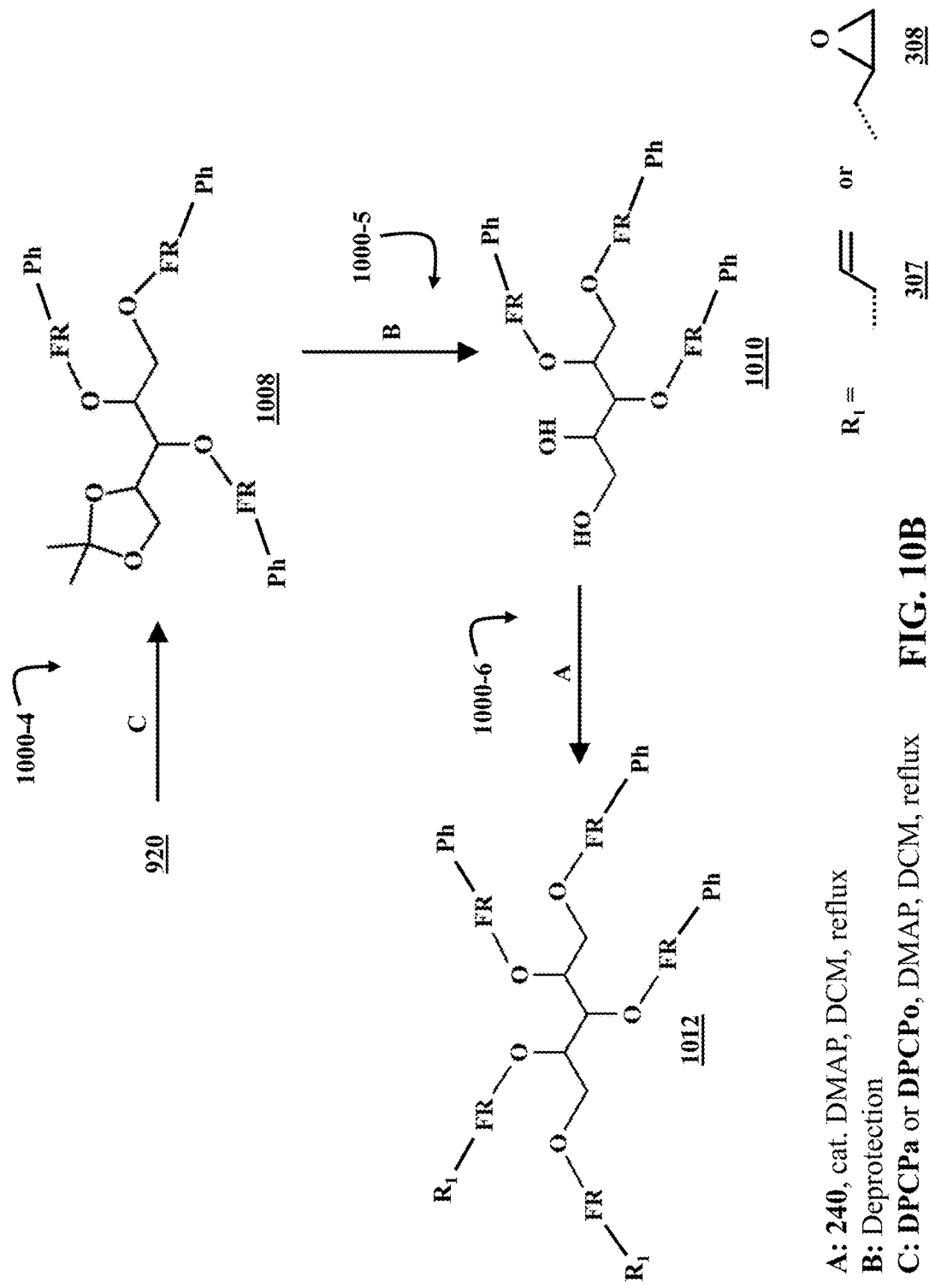
FIG. 10B is a chemical reaction diagram illustrating three processes collectively used to synthesize a difunctionalized flame retardant arabitol or xylitol molecule, in accordance with embodiments of the present disclosure.

FIG. 10B is a chemical reaction diagram illustrating three processes 1000-4, 1000-5, and 1000-6 collectively used to synthesize a difunctionalized flame retardant arabitol or xylitol molecule 1012, in accordance with embodiments of the present disclosure. In process 1000-4, di-protected arabitol or xylitol 920 is reacted with either diphenyl chlorophosphate (DPCPa) or diphenylphosphinic chloride (DPCPo). The mixture is refluxed with catalytic dimethylaminopyridine (DMAP) in a dichloromethane (DCM) solution, yielding a di-protected flame retardant arabitol or xylitol precursor 1008. In process 1000-5, the di-protected flame retardant arabitol or xylitol precursor 1008 is deprotected, yielding a flame retardant arabitol or xylitol precursor 1010. In process 1000-6, the flame retardant arabitol or xylitol precursor 1010 is reacted with the phosphorus-based flame retardant molecule 240 and catalytic dimethylaminopyridine (DMAP) in a dichloromethane (DCM) solution, yielding the difunctionalized flame retardant arabitol or xylitol molecule 1012.

Figure 10C:
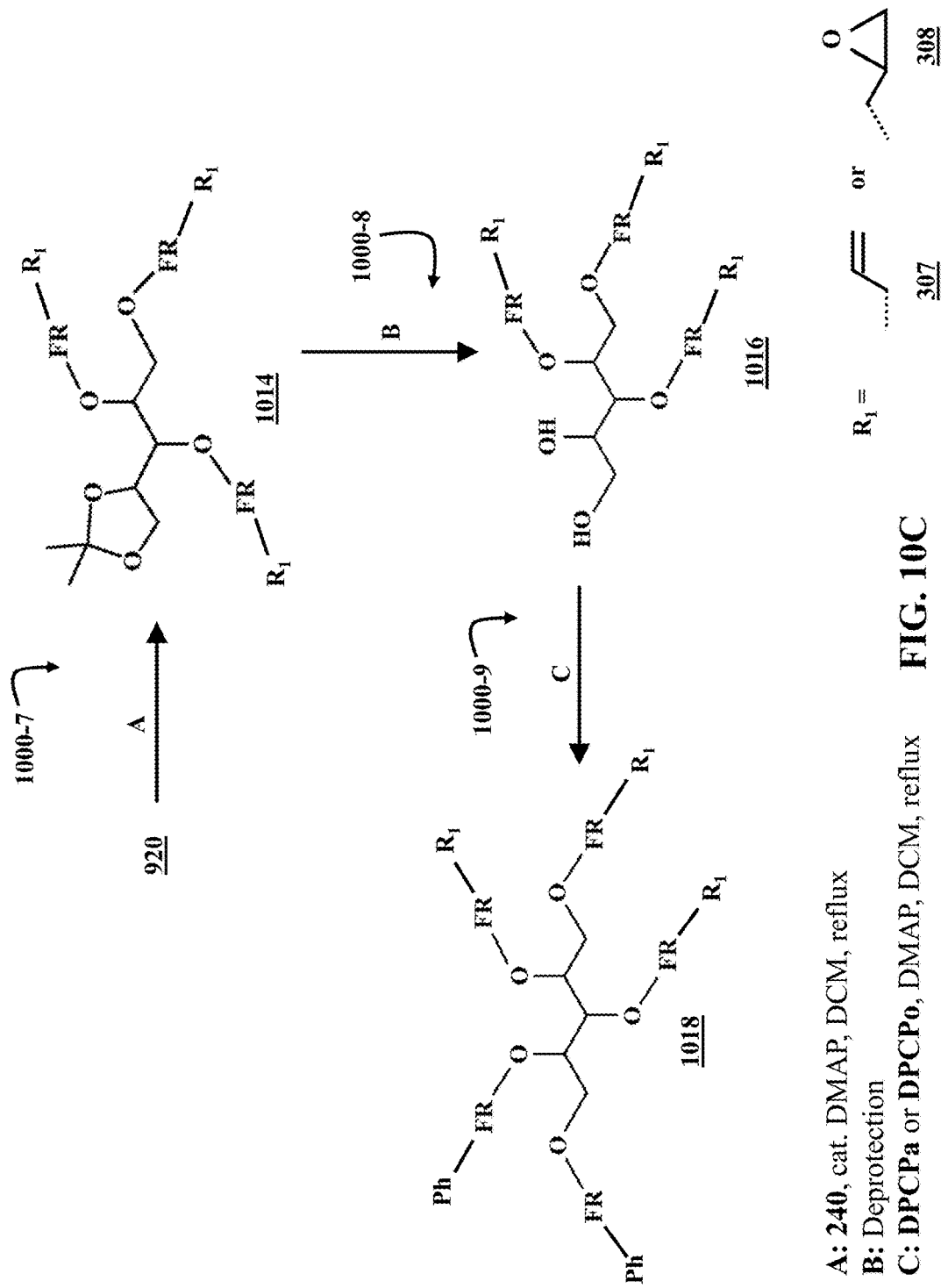
FIG. 10C is a chemical reaction diagram illustrating three processes collectively used to synthesize a trifunctionalized flame retardant arabitol or xylitol molecule, in accordance with embodiments of the present disclosure.

FIG. 10C is a chemical reaction diagram illustrating three processes 1000-7, 1000-8, and 1000-9 collectively used to synthesize a trifunctionalized flame retardant arabitol or xylitol molecule 1018, in accordance with embodiments of the present disclosure. In process 1000-7, di-protected arabitol or xylitol 920 is reacted with the phosphorus-based flame retardant molecule 240 and catalytic dimethylaminopyridine (DMAP) in a dichloromethane (DCM) solution, yielding a di-protected trifunctionalized flame retardant arabitol or xylitol molecule 1014. In process 1000-8, the di-protected trifunctionalized flame retardant arabitol or xylitol molecule 1014 is deprotected, yielding a trifunctionalized flame retardant arabitol or xylitol precursor 1016. In process 1000-9, the trifunctionalized flame retardant arabitol or xylitol precursor 1016 is reacted with either diphenyl chlorophosphate (DPCPa) or diphenylphosphinic chloride (DPCPo). The mixture is refluxed with catalytic dimethyl-aminopyridine (DMAP) in a dichloromethane (DCM) solution, yielding the trifunctionalized flame retardant arabitol or xylitol molecule 1018.

Figure 10D:
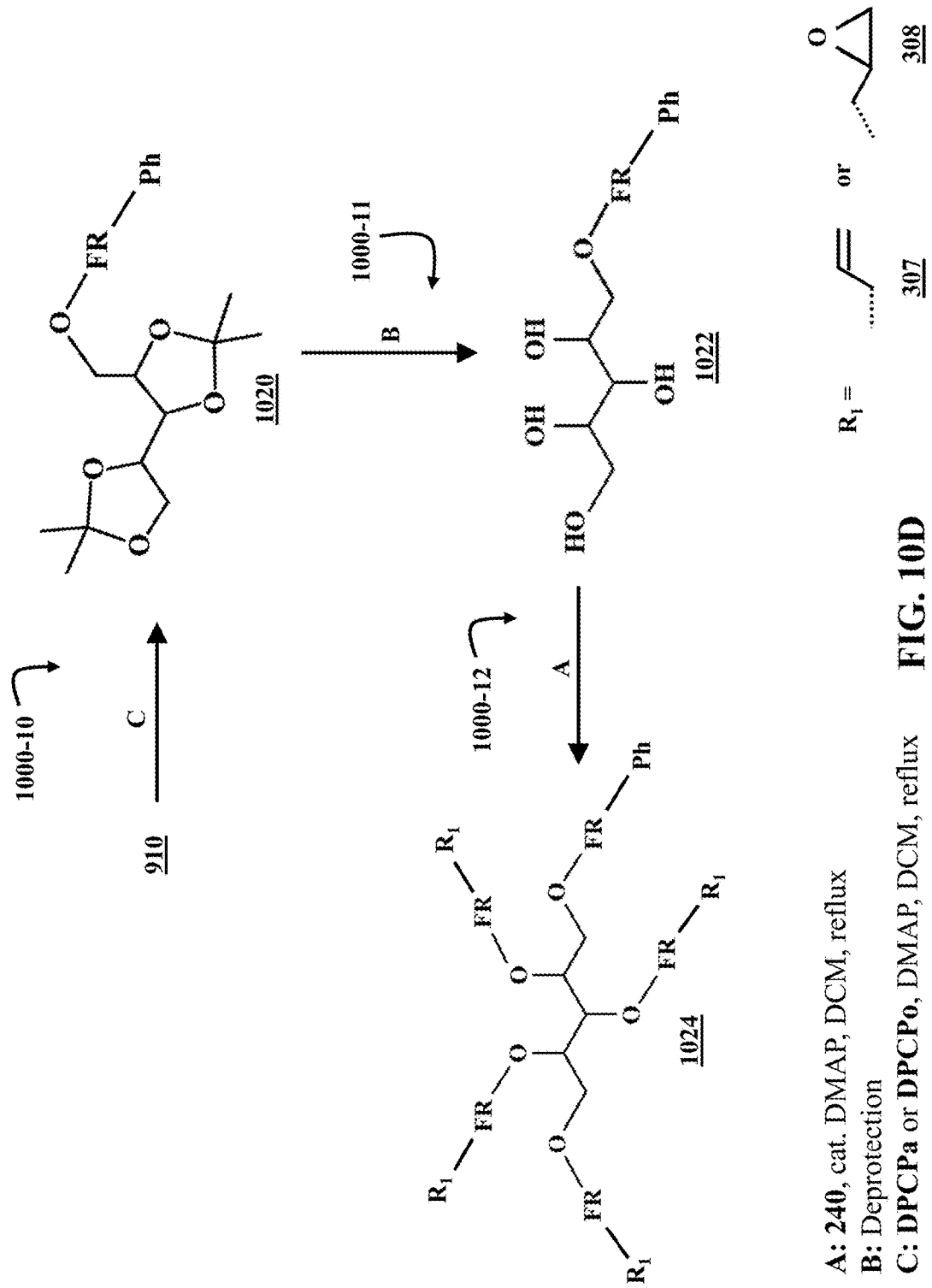
FIG. 10D is a chemical reaction diagram illustrating three processes collectively used to synthesize a tetrafunctionalized flame retardant arabitol or xylitol molecule, in accordance with embodiments of the present disclosure.

FIG. 10D is a chemical reaction diagram illustrating three processes 1000-10, 1000-11, and 1000-12 collectively used to synthesize a tetrafunctionalized flame retardant arabitol or xylitol molecule 1024, in accordance with embodiments of the present disclosure. In process 1000-10, tetra-protected arabitol or xylitol 910 is reacted with either diphenyl chlorophosphate (DPCPa) or diphenylphosphinic chloride (DPCPo). The mixture is refluxed with catalytic dimethylaminopyridine (DMAP) in a dichloromethane (DCM) solution, yielding a tetra-protected flame retardant arabitol or xylitol precursor 1020. In process 1000-11, the tetra-protected flame retardant arabitol or xylitol precursor 1020 is deprotected, yielding a flame retardant arabitol or xylitol precursor 1022. In process 1000-12, the flame retardant arabitol or xylitol precursor 1022 is reacted with the phosphorus-based flame retardant molecule 240 and catalytic dimethylaminopyridine (DMAP) in a dichloromethane (DCM) solution, yielding the tetrafunctionalized flame retardant arabitol or xylitol molecule 1024.

With respect to FIG. 10A through FIG. 10D, the same reaction conditions as implemented in FIG. 8A and FIG. 8B can be implemented to synthesize thioether-linked multi-functionalized flame retardants. Specifically, allyl mono-, di-, tri-, and tetra-functionalized flame retardant derivatives can be reacted with thiol-ene molecules mercaptoethanol 410, cysteamine HCl 420, and 3-mercaptopropionate 430 (illustrated in FIG. 4) to yield mono-, di-, tri-, and tetra-functionalized thioether-linked flame retardant molecules.

Figure 11A:
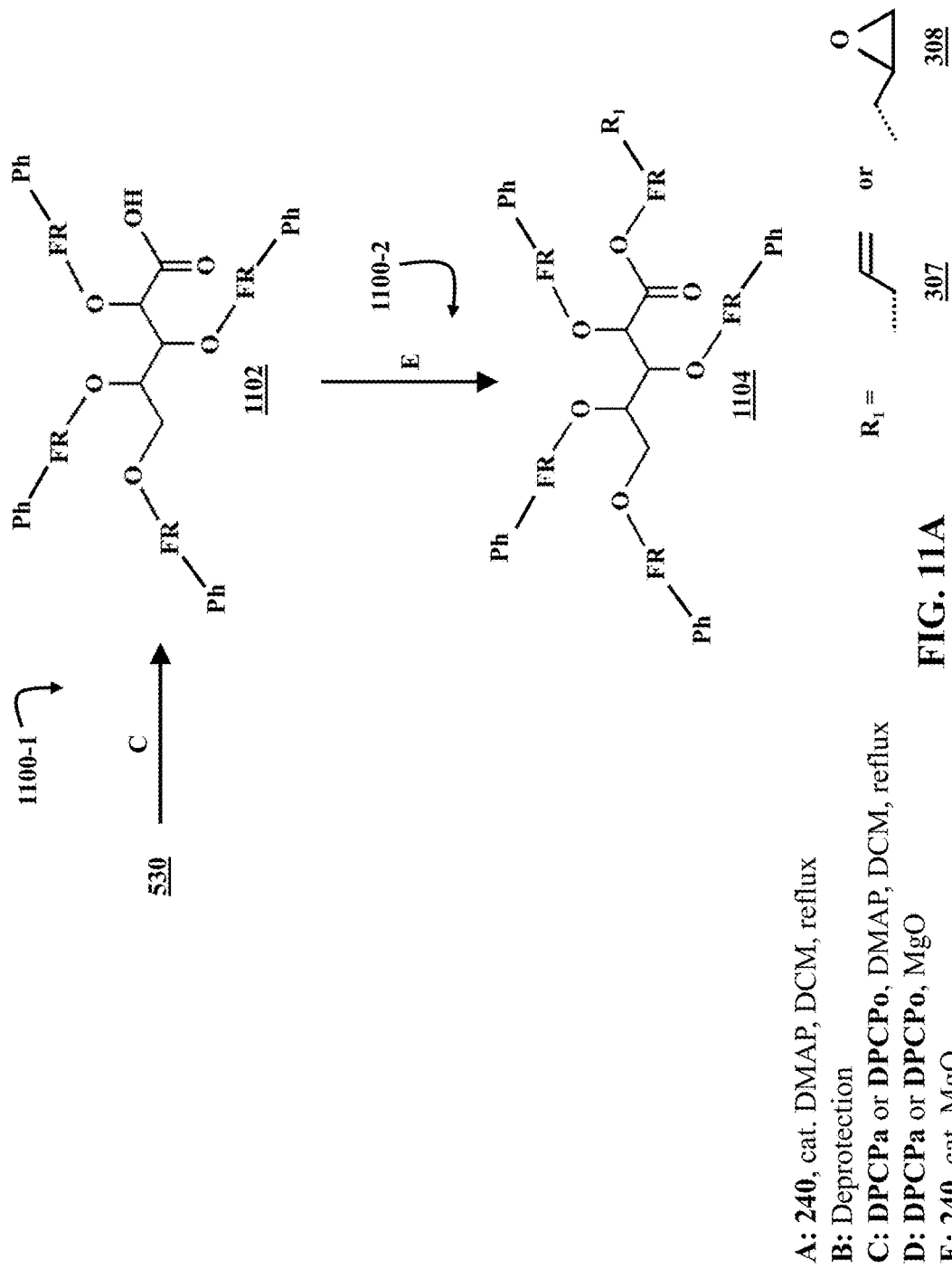
FIG. 11A is a chemical reaction diagram illustrating two processes collectively used to form a monofunctionalized flame retardant arabic acid or xylonic molecule, in accordance with embodiments of the present disclosure.

FIG. 11A is a chemical reaction diagram illustrating two processes 1100-1 and 1100-2 collectively used to form a monofunctionalized flame retardant arabic acid or xylonic molecule 1104, in accordance with embodiments of the present disclosure. In process 1100-1, arabic acid or xylonic acid 530 is reacted with either diphenyl chlorophosphate (DPCPa) or diphenylphosphinic chloride (DPCPo) and catalytic dimethylaminopyridine (DMAP) in a dichloromethane (DCM) solution, yielding a monofunctionalized flame retardant arabic acid or xylonic acid precursor 1102. In process 1100-2, the monofunctionalized flame retardant arabic acid or xylonic acid precursor 1102 is reacted with the phosphorus-based flame retardant molecule 240 and magnesium oxide (MgO), yielding the monofunctionalized flame retardant arabic acid or xylonic molecule 1104.

Figure 11B:
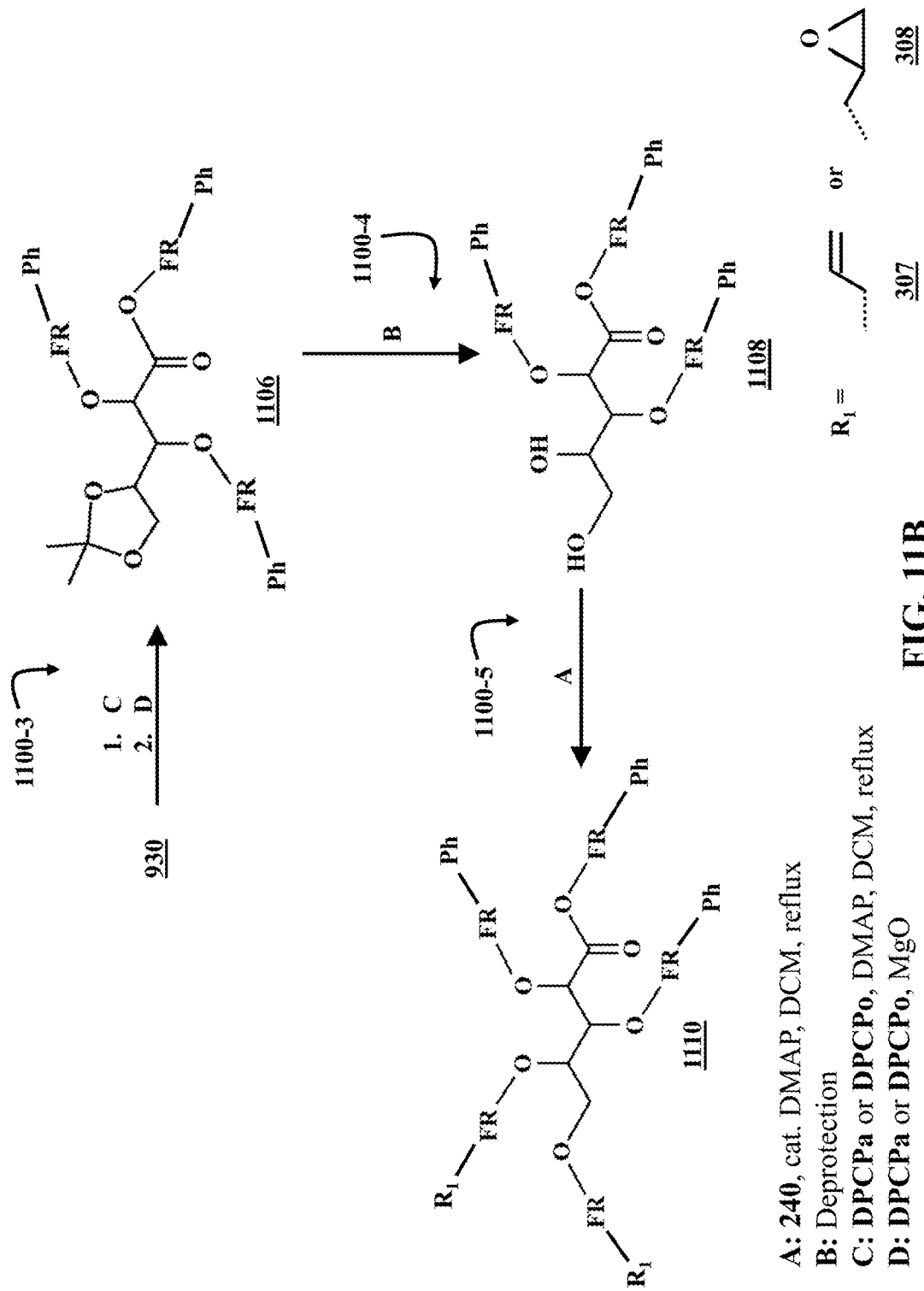
FIG. 11B is a chemical reaction diagram illustrating three processes collectively used to synthesize a difunctionalized flame retardant arabic acid or xylonic acid molecule, in accordance with embodiments of the present disclosure

FIG. 11B is a chemical reaction diagram illustrating three processes 1100-3, 1100-4, and 1100-5 collectively used to synthesize a difunctionalized flame retardant arabic acid or xylonic acid molecule 1110, in accordance with embodiments of the present disclosure. In process 1100-3, di-protected arabic acid or xylonic acid 930 reacted with either diphenyl chlorophosphate (DPCPa) or diphenylphosphinic chloride (DPCPo). The mixture is refluxed with catalytic dimethylaminopyridine (DMAP) in a dichloromethane (DCM) solution. The mixture is then reacted with catalytic dimethylaminopyridine (DMAP) in a dichloromethane (DCM) solution and MgO, yielding a di-protected flame retardant arabic acid or xylonic acid precursor 1106. In process 1100-4, the di-protected flame retardant arabic acid or xylonic acid precursor 1106 is deprotected, yielding a flame retardant arabic acid or xylonic acid precursor 1108. In process 1000-6, the flame retardant arabic acid or xylonic acid precursor 1108 is reacted with the phosphorus-based flame retardant molecule 240 and catalytic dimethylaminopyridine (DMAP) in a dichloromethane (DCM) solution, yielding the difunctionalized flame retardant arabic acid or xylonic acid molecule 1110.

Figure 11C:
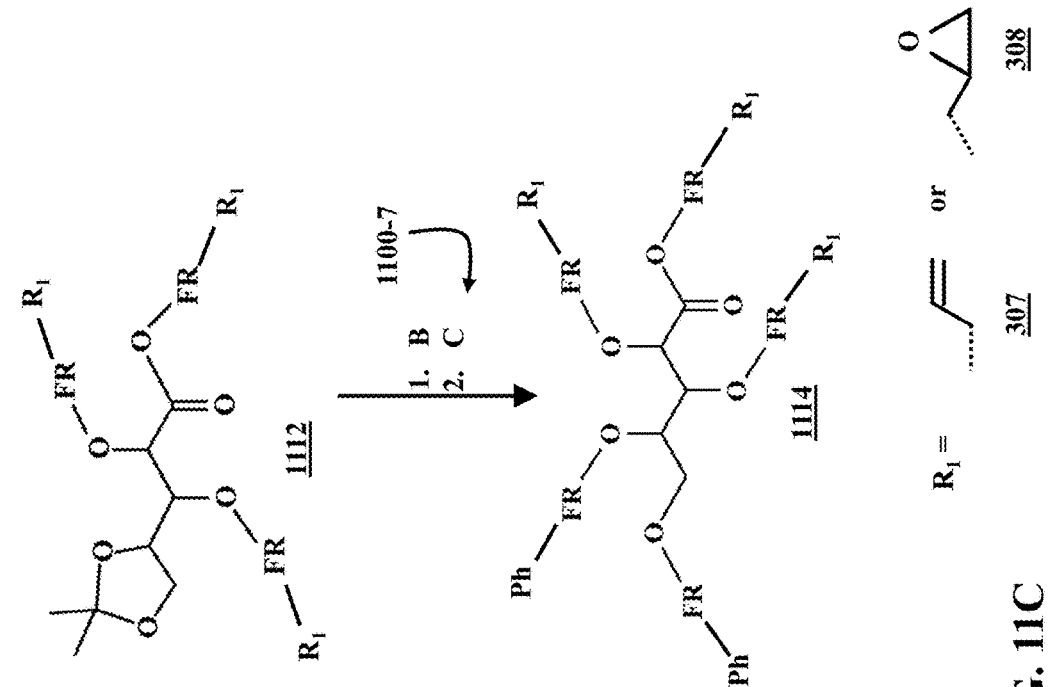
FIG. 11C is a chemical reaction diagram illustrating two processes collectively used to form a trifunctionalized flame retardant arabic acid or xylonic molecule, in accordance with embodiments of the present disclosure.

FIG. 11C is a chemical reaction diagram illustrating two processes 1100-6 and 1100-7 collectively used to form a trifunctionalized flame retardant arabic acid or xylonic molecule 1114, in accordance with embodiments of the present disclosure. In process 1100-6, the di-protected arabic acid or xylonic acid 930 is reacted with the phosphorus-based flame retardant molecule 240 and catalytic dimethylaminopyridine (DMAP) in a dichloromethane (DCM) solution. Thereafter, the resulting product is reacted with the phosphorus-based flame retardant molecule 240 and MgO, yielding a di-protected trifunctionalized flame retardant arabic acid or xylonic acid precursor 1112. In process 1100-7, the di-protected trifunctionalized flame retardant arabic acid or xylonic acid precursor 1112 is first deprotected, and then reacted with either diphenyl chlorophosphate (DPCPa) or diphenylphosphinic chloride (DPCPo). The mixture is refluxed with catalytic dimethylaminopyridine (DMAP) in a dichloromethane (DCM) solution, yielding the trifunctionalized flame retardant arabic acid or xylonic acid molecule 1114.

Figure 11D:
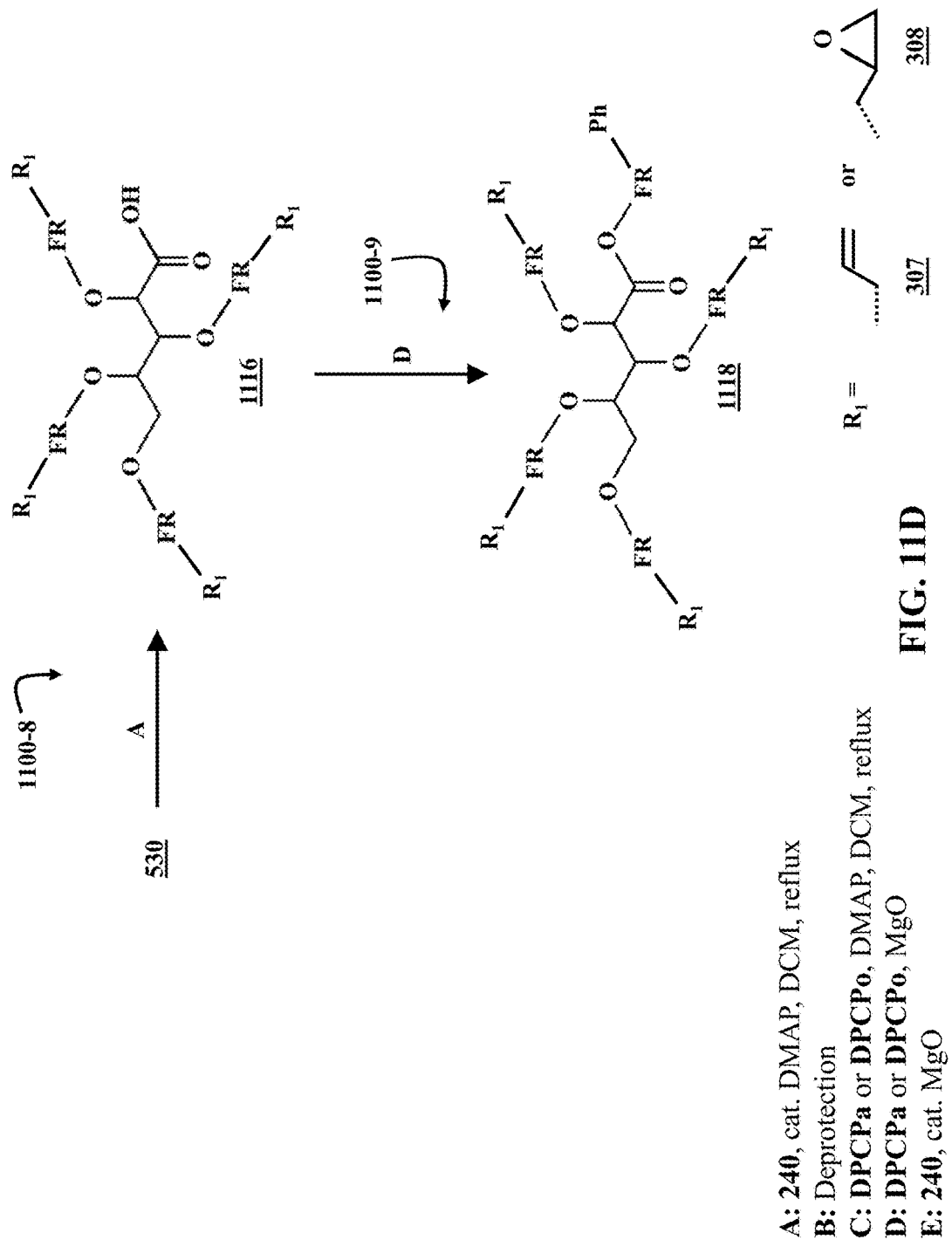
FIG. 11D is a chemical reaction diagram illustrating two processes collectively used to form a tetrafunctionalized flame retardant arabic acid or xylonic molecule, in accordance with embodiments of the present disclosure.

FIG. 11D is a chemical reaction diagram illustrating two processes 1100-8 and 1100-9 collectively used to form a tetrafunctionalized flame retardant arabic acid or xylonic molecule 1118, in accordance with embodiments of the present disclosure. In process 1100-8, arabic acid or xylonic acid 530 is reacted with the phosphorus-based flame retardant molecule 240 and catalytic dimethylaminopyridine (DMAP) in a dichloromethane (DCM) solution, yielding a tetrafunctionalized flame retardant arabic acid or xylonic acid precursor 1116. In process 1100-2, the tetrafunctionalized flame retardant arabic acid or xylonic acid precursor 1116 is reacted with either diphenyl chlorophosphate (DPCPa) or diphenylphosphinic chloride (DPCPo) and magnesium oxide (MgO), yielding the tetrafunctionalized flame retardant arabic acid or xylonic acid molecule 1118.

With respect to FIGS. 10-11, the same reaction conditions as illustrated in FIG. 8C can be used to synthesize propylene carbonate multi-functionalized molecules from epoxy multi-functionalized molecules. That is, epoxy mono-, di-, tri-, and tetra-functionalized molecules synthesized in FIGS. 10-11 can be converted into propylene carbonate mono-, di-, tri-, and tetra-functionalized molecules respectively implementing the conditions (e.g., LiBr, $CO_2$) illustrated in FIG. 8C.

With reference to the FIGS. 6-11, in some embodiments meta-chloroperoxybenzoic acid (mCPBA) can be used to oxidize allyl $R_1$ functional groups 307 into epoxy $R_1$ functional groups 308, as opposed to binding the allyl groups directly to the precursor molecules (e.g., arabitol or xylitol 525 or arabic acid or xylonic acid 530). For example, flame retardant molecules 615-2 and 620-2 can be converted into flame retardant molecules 615-1, and 620-1 via reaction with mCPBA. These mCPBA reactions can be completed with any allyl functionalized flame retardant molecule, including ally difunctionalized, trifunctionalized, tetrafunctionalized, and pentafunctionalized molecules.

Further, in some embodiments, stoichiometric trimethylamine is used instead of DMAP to phosphorylate the hydroxyl functional groups. In some embodiments, phosphorylating hydroxyl functional groups includes reacting the selected precursor and flame retardant molecule in a solution containing water ($H_2O$), ethanol (EtOH), carbon tetrachloride ($CCl_4$), and triethylamine ($Et_3N$) for 2 hours at a temperature of approximately 0-20° C.

Figure 12:
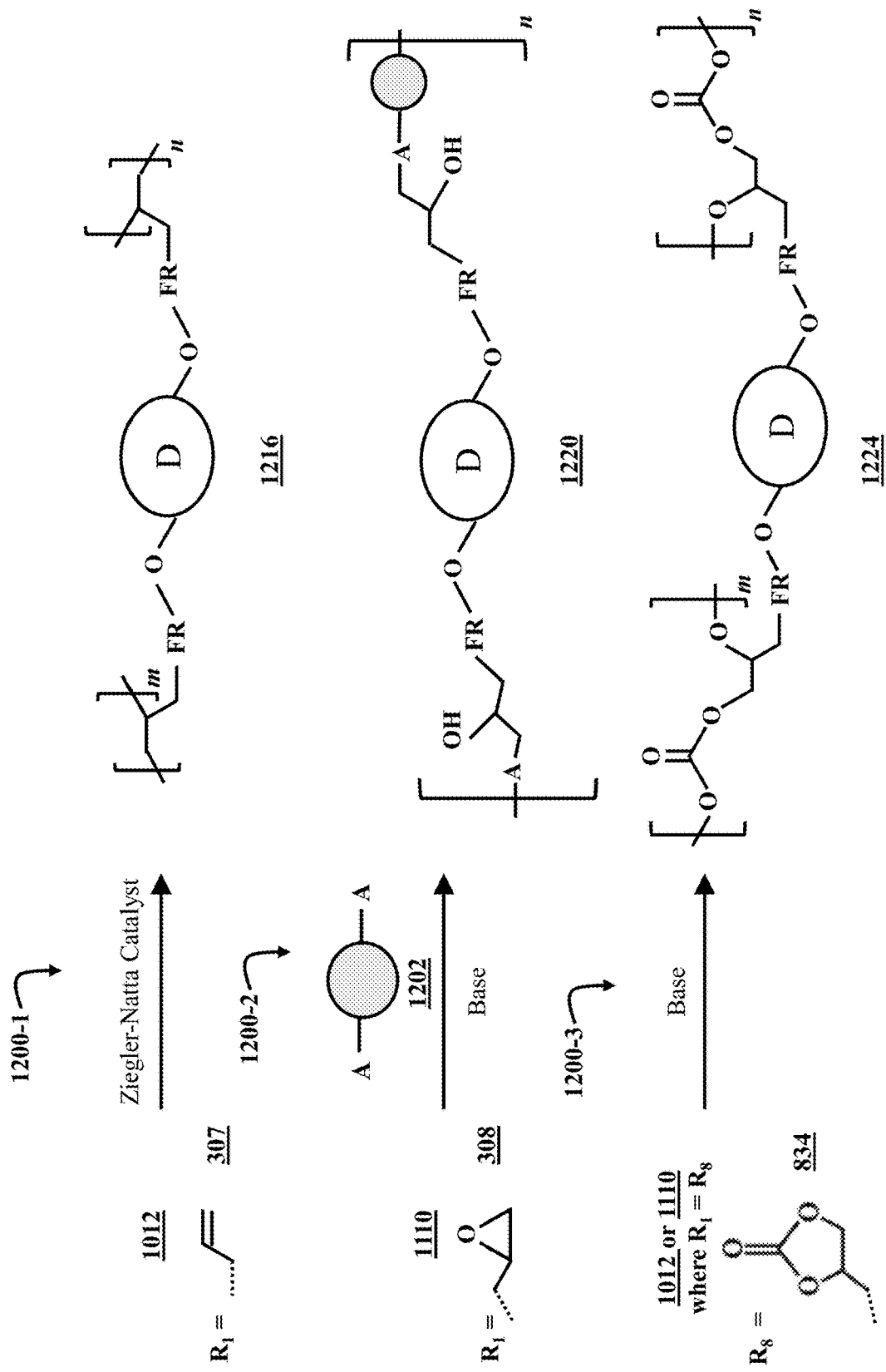
FIG. 12 is a chemical reaction diagram illustrating three processes of synthesizing flame retardant arabitol, xylitol, arabic acid, and xylonic acid based polymers from flame retardant arabitol, xylitol, arabic acid, and xylonic acid monomers, in accordance with embodiments of the present disclosure.

FIG. 12 is a chemical reaction diagram illustrating three processes 1200-1, 1200-2, and 1200-3 of synthesizing flame retardant arabitol, xylitol, arabic acid, and xylonic acid based polymers 1216, 1220, and 1224 from flame retardant arabitol, xylitol, arabic acid, and xylonic acid monomers, in accordance with embodiments of the present disclosure. Each structure shows the R functional groups (i.e., allyl, epoxy, or propylene carbonate) and their respective polymerization reactions (e.g., for only di-functionalized compounds). An oval labeled "D" represents the arabitol-derivative, xylitol-derivative, arabic acid-derivative, and xylonic acid-derivative core of each monomer. The reactions illustrated herein are prophetic examples of polymers that can be synthesized from the flame retardant arabitol, xylitol, arabic acid, and xylonic acid monomers, but other polymers can be produced as well (e.g., by changing reaction conditions, co-monomers, R groups, etc.).

Processes 1200-1, 1200-2, and 1200-3 illustrate the polymerization of difunctionalized flame retardant arabitol, xylitol, arabic acid, and xylonic acid molecules 1012 and 1110 only. However, it should be noted that each of these polymerization reactions can also be carried out with the trifunctionalized flame retardant arabitol, xylitol, arabic acid, and xylonic acid derived molecules (e.g., 1018 and 1114), tetrafunctionalized flame retardant arabitol, xylitol, arabic acid, and xylonic acid molecules (e.g., 1024 and 1118) and pentafunctionalized flame retardant arabitol, xylitol, arabic acid, and xylonic acid derived molecules (e.g., 615, 620, 814 and 816). Further, processes 1200-1 and 1200-3 may similarly be carried out with monofunctionalized flame retardant arabitol, xylitol, arabic acid, and xylonic acid (e.g., 1006 and 1104).

In some embodiments, the polymerization reactions are carried out with a combination of mono-, di-, tri-, tetra-, and/or pentafunctionalized monomers. Any combination of these monomers may be polymerized. Further, any ratio of monomers may be combined.

In process 1200-1, allyl-derived flame retardant arabitol, xylitol, arabic acid, and xylonic acid based polymers 1216 are formed from allyl difunctionalized flame retardant arabitol or xylitol molecules 1012 and arabic acid or xylonic acid molecules 1110. The allyl difunctionalized flame retardant arabitol or xylitol molecules 1012 and arabic acid or xylonic acid molecules 1110 are reacted with a Ziegler-Natta catalyst. Ziegler-Natta catalysts catalyze the polymerization of 1-alkenes. Examples of these catalysts can include heterogeneous Ziegler-Natta catalysts based on titanium compounds and homogeneous Ziegler-Natta catalysts based on complexes of titanium, zirconium, or hafnium. Heterogeneous and homogeneous Ziegler-Natta catalysts can be used in combination with organoaluminum co-catalysts in some embodiments.

In process 1200-2, epoxy-derived flame retardant arabitol, xylitol, arabic acid, and xylonic acid based polymers 1220 are formed from epoxy difunctionalized flame retardant arabitol or xylitol molecules 1012 and arabic acid or xylonic acid molecules 1110. The epoxy difunctionalized flame retardant arabitol or xylitol molecules 1012 and arabic acid or xylonic acid molecules 1110 are reacted with a base and a second monomer 1202. The second monomer 1202 is a compound with at least two hydroxyl (—OH) groups or at least two amino (—$NH_2$) groups (e.g., a diol, polyol, diamine, polyamine, etc.). These compounds 1202 are illustrated as a gray oval with attached A groups. The A group represents a hydroxyl group or an amino group. It should be noted that, while two A groups are illustrated herein, there are more than two A groups in some embodiments. Additionally, in some embodiments, the epoxy difunctionalized flame retardant arabitol or xylitol molecules 1012 and arabic acid or xylonic acid molecules 1110 self-polymerize under basic conditions. In these instances, the reaction does not include the second monomer 1202.

In process 1200-3, propylene carbonate-derived flame retardant arabitol, xylitol, arabic acid, and xylonic acid based polymers 1224 are formed from propylene carbonate-difunctionalized flame retardant arabitol, xylitol, arabic acid, and xylonic acid molecules (not illustrated, however $R_1$ allyl/epoxy groups are replaced with $R_8$ propylene carbonate groups). The propylene carbonate difunctionalized flame retardant arabitol, xylitol, arabic acid, and xylonic acid molecules are reacted in a ring-opening polymerization initiated by a base. Examples of bases that can be used as initiators can include potassium hydroxide (KOH), sodium hydroxide (NaOH), lithium hydroxide (LiOH), etc.

In addition to the polymers illustrated in FIG. 12, the flame retardant arabitol, xylitol, arabic acid, and xylonic acid derivatives disclosed herein can be used in the synthesis of other flame retardant polymers, in some embodiments. An array of classes of flame retardant polymers can be made with different combinations of monomers. These polymerization processes are in accordance with polymer chemistry platforms that can include polyhydroxyurethanes, polycarbonates, polymers obtained by radical polymerization, polyurethanes, polyesters, polyacrylates, polycarbonates, epoxy resins, polyimides, polyureas, polyamides, poly(vinyl-esters), etc.

One example of an application of polymers made, at least in part, from flame retardant arabitol, xylitol, arabic acid, and xylonic acid derivatives is in plastics used in electronics hardware. Additional applications can include acoustic dampening, cushioning, plastics, synthetic fibers, insulation, etc. The flame retardant arabitol, xylitol, arabic acid, and xylonic acid derivatives can also be used to make adhesives such as bio-adhesives, elastomers, thermoplastics, emulsions, thermosets, etc. Further, materials containing the flame retardant arabitol, xylitol, arabic acid, and xylonic acid derivatives can be incorporated into various devices with electronic components that can include printed circuit boards (PCBs), semiconductors, transistors, optoelectronics, capacitors, resistors, etc.

Resins for printed circuit boards (PCBs) can be made flame retardant by incorporating polymers that are made, at least in part, from arabitol, xylitol, arabic acid, and xylonic acid derivatives. PCBs are electrical circuits that can be found in most types of electronic devices, and they support and electronically connect electrical components in the device. PCBs are formed by etching a copper conductive layer laminated onto an insulating substrate. The insulating substrate can be a laminate comprising a resin and a fiber. Many resins in PCBs contain a polymer, such as an epoxy, a polyhydroxyurethane, a polycarbonate, a polyester, a polyacrylate, a polyimide, a polyamide, a polyurea, a poly(vinyl-ester), etc. Using polymers that incorporate the flame retardant arabitol, xylitol, arabic acid, and xylonic acid derivatives can prevent the PCB from catching fire when exposed to high temperature environments or electrical power overloads.

It should be noted that, in some embodiments, the compounds described herein can contain one or more chiral centers. These can include racemic mixtures, diastereomers, enantiomers, and mixtures containing one or more stereoisomer. Further, the disclosed can encompass racemic forms of the compounds in addition to individual stereoisomers, as well as mixtures containing any of these.

The synthetic processes discussed herein and their accompanying drawings are prophetic examples, and are not limiting; they can vary in reaction conditions, components, methods, etc. In addition, the reaction conditions can optionally be changed over the course of a process. Further, in some embodiments, processes can be added or omitted while still remaining within the scope of the disclosure, as will be understood by a person of ordinary skill in the art.

What is claimed is:

1. A flame retardant sugar-derived molecule with a formula of:

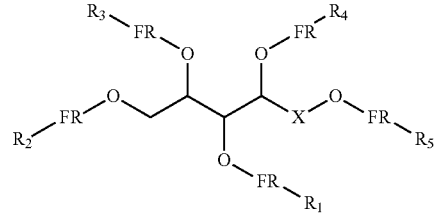

wherein X is selected from a group consisting of a methanediyl moiety and a carbonyl moiety;
wherein FR is a phosphorus-based moiety; and
wherein $R_1$-$R_5$ are a propylene carbonate substituent.

2. The flame retardant sugar-derived molecule of claim 1, wherein the FR is a phosphoryl moiety with a formula of:

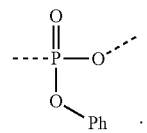

3. The flame retardant sugar-derived molecule of claim 1, wherein the FR is a phosphonyl moiety with a formula of:

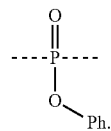

* * * * *